US010284192B2

(12) United States Patent
Akahane

(10) Patent No.: US 10,284,192 B2
(45) Date of Patent: May 7, 2019

(54) SEMICONDUCTOR DEVICE

(71) Applicant: FUJI ELECTRIC CO., LTD., Kawasaki-shi, Kanagawa (JP)

(72) Inventor: Masashi Akahane, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/986,367

(22) Filed: May 22, 2018

(65) Prior Publication Data

US 2018/0269864 A1 Sep. 20, 2018

Related U.S. Application Data

(63) Continuation of application No. PCT/JP2017/016730, filed on Apr. 27, 2017.

(30) Foreign Application Priority Data

Jun. 3, 2016 (JP) .................. 2016-111851

(51) Int. Cl.
*H03K 17/082* (2006.01)
*G11C 16/10* (2006.01)
*G11C 16/04* (2006.01)
*G11C 16/12* (2006.01)
*G11C 16/26* (2006.01)
(Continued)

(52) U.S. Cl.
CPC ..... *H03K 17/0828* (2013.01); *G11C 16/0408* (2013.01); *G11C 16/10* (2013.01); *G11C 16/12* (2013.01); *G11C 16/26* (2013.01); *G11C 16/32* (2013.01); *G11C 29/021* (2013.01); *G11C 29/028* (2013.01); *G11C 29/48* (2013.01); *G11C 29/50* (2013.01); *G11C 29/56012* (2013.01); *G11C 2029/5002* (2013.01);
(Continued)

(58) Field of Classification Search
CPC ..... G11C 16/0408; G11C 16/12; G11C 16/26; G11C 16/32; H03K 17/0828
USPC .... 327/108–112, 427, 434, 437; 326/82, 83, 326/87; 702/85, 86–107
See application file for complete search history.

(56) References Cited

U.S. PATENT DOCUMENTS

2002/0130650 A1* 9/2002 Nagase .................. G01D 3/022
323/371
2002/0149984 A1 10/2002 Nishikawa et al.
(Continued)

FOREIGN PATENT DOCUMENTS

JP H02-122497 A 5/1990
JP H03-207122 A 9/1991
(Continued)

*Primary Examiner* — Tomi Skibinski
(74) *Attorney, Agent, or Firm* — Rabin & Berdo, P.C.

(57) ABSTRACT

A semiconductor device including a first control circuit, a memory and a second control circuit. The first control circuit includes a monitoring section which receives a voltage signal which includes a pulse signal having a plurality of different voltage levels superimposed on a power source voltage, monitors a level of the voltage signal and outputs a monitoring result, and a regulator which generates an internal voltage. The memory receives the internal voltage. The second control circuit receives the internal voltage, reproduces a clock and data from the pulse signal on the basis of the monitoring result, and performs trimming on the memory using the clock and the data.

7 Claims, 21 Drawing Sheets

(51) Int. Cl.
*G11C 16/32* (2006.01)
*G11C 29/50* (2006.01)
*G11C 29/02* (2006.01)
*G11C 29/48* (2006.01)
*G11C 29/56* (2006.01)
*H03K 17/08* (2006.01)

(52) U.S. Cl.
CPC ........... *G11C 2029/5004* (2013.01); *G11C 2029/5602* (2013.01); *H03K 2017/0806* (2013.01)

(56) References Cited

U.S. PATENT DOCUMENTS

| | | | |
|---|---|---|---|
| 2006/0044048 A1* | 3/2006 | Nagase | G01D 3/022 327/513 |
| 2012/0206091 A1 | 8/2012 | Tanaka et al. | |
| 2015/0309090 A1* | 10/2015 | Akahane | H03K 17/0828 324/537 |
| 2017/0126390 A1* | 5/2017 | Akahane | H04L 25/49 |

FOREIGN PATENT DOCUMENTS

| | | |
|---|---|---|
| JP | 2002-310735 A | 10/2002 |
| JP | 2002-350256 A | 12/2002 |
| JP | 2006-071336 A | 3/2006 |
| JP | 2011-081660 A | 4/2011 |
| JP | 2012-169746 A | 9/2012 |

* cited by examiner

FUNCTION TABLE

| INPUT | | | OUTPUT | |
|---|---|---|---|---|
| CGE | FUNCTION | DRV | OUT/CG | CG |
| 0 (GND) | OUTPUT MODE | 0 (GND) | — | 0 (GND) | Hi-Z |
| 0 (GND) | OUTPUT MODE | 1 (VCC) | — | 1 (VCC) | Hi-Z |
| 1 (REG5) | INPUT MODE | Don't care | 18 V | — | 18 V |

| No. | NAME | 3-BIT REGISTER VALUE | FUNCTION |
|---|---|---|---|
| 1 | OUTPUT | 000 | OUTPUT SERIAL DATA |
| 2 |  | 001 | EMPTY |
| 3 | REFERENCE | 010 | SET CONTENTS OF EPROM IN S.R. |
| 4 | ADJUSTMENT | 011 | OUTPUT OR OF CONTENTS OF S.R. AND CONTENTS OF EPROM |
| 5 | WRITE | 100 | WRITE CONTENTS OF S.R. TO EPROM |
| 6 |  | 101 | EMPTY |
| 7 |  | 110 | EMPTY |
| 8 | RESET | 111 | RESET S.R. AND MODE SETTING |

FIG. 11

OPERATIONAL WAVEFORM AT NORMAL OPERATION TIME
(STATE IN WHICH CAPACITOR C1 IS CONNECTED)

OPERATIONAL WAVEFORM AT TRIMMING CONTROL TIME
(STATE IN WHICH CAPACITOR C1 IS DISCONNECTED)

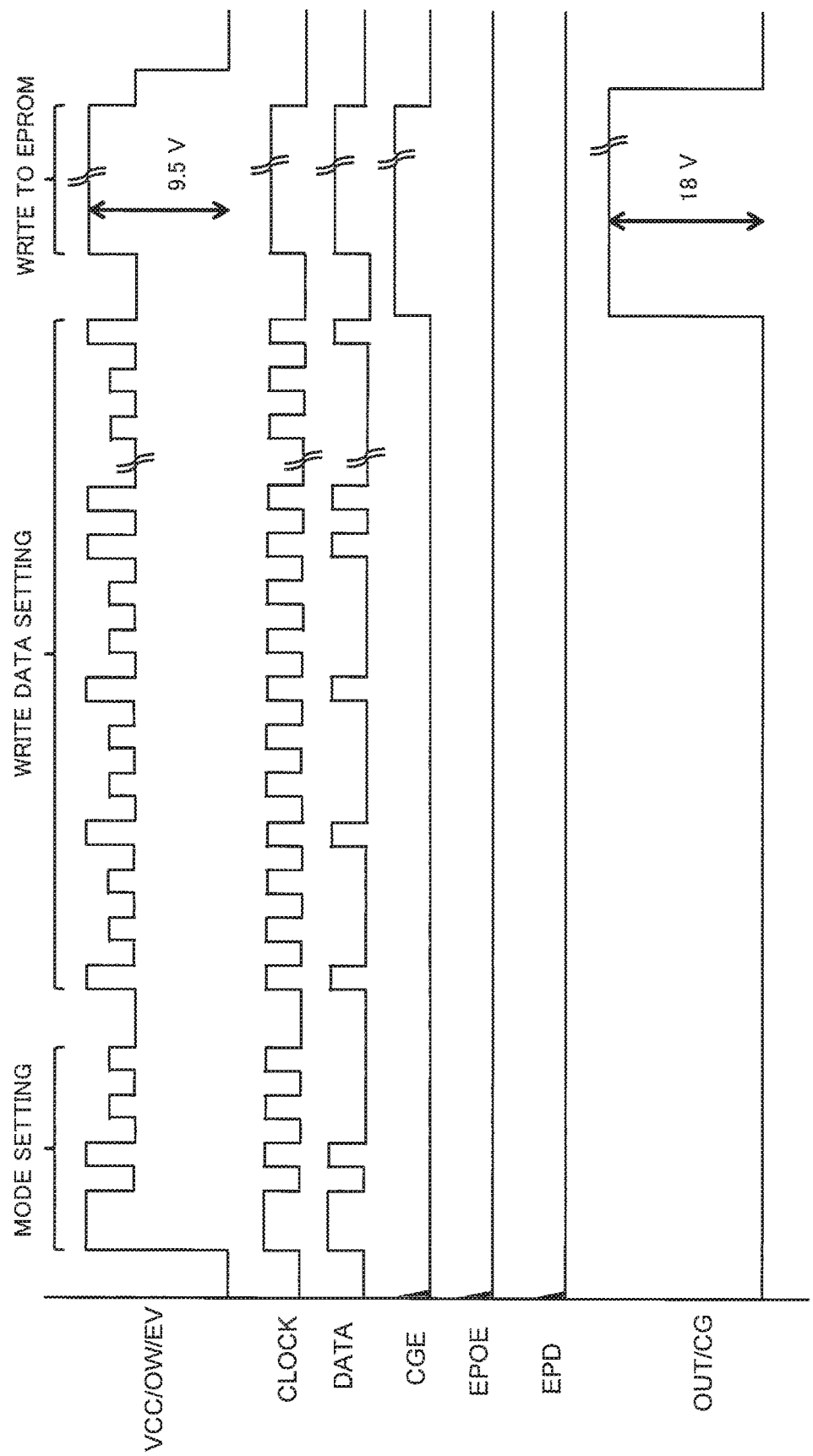

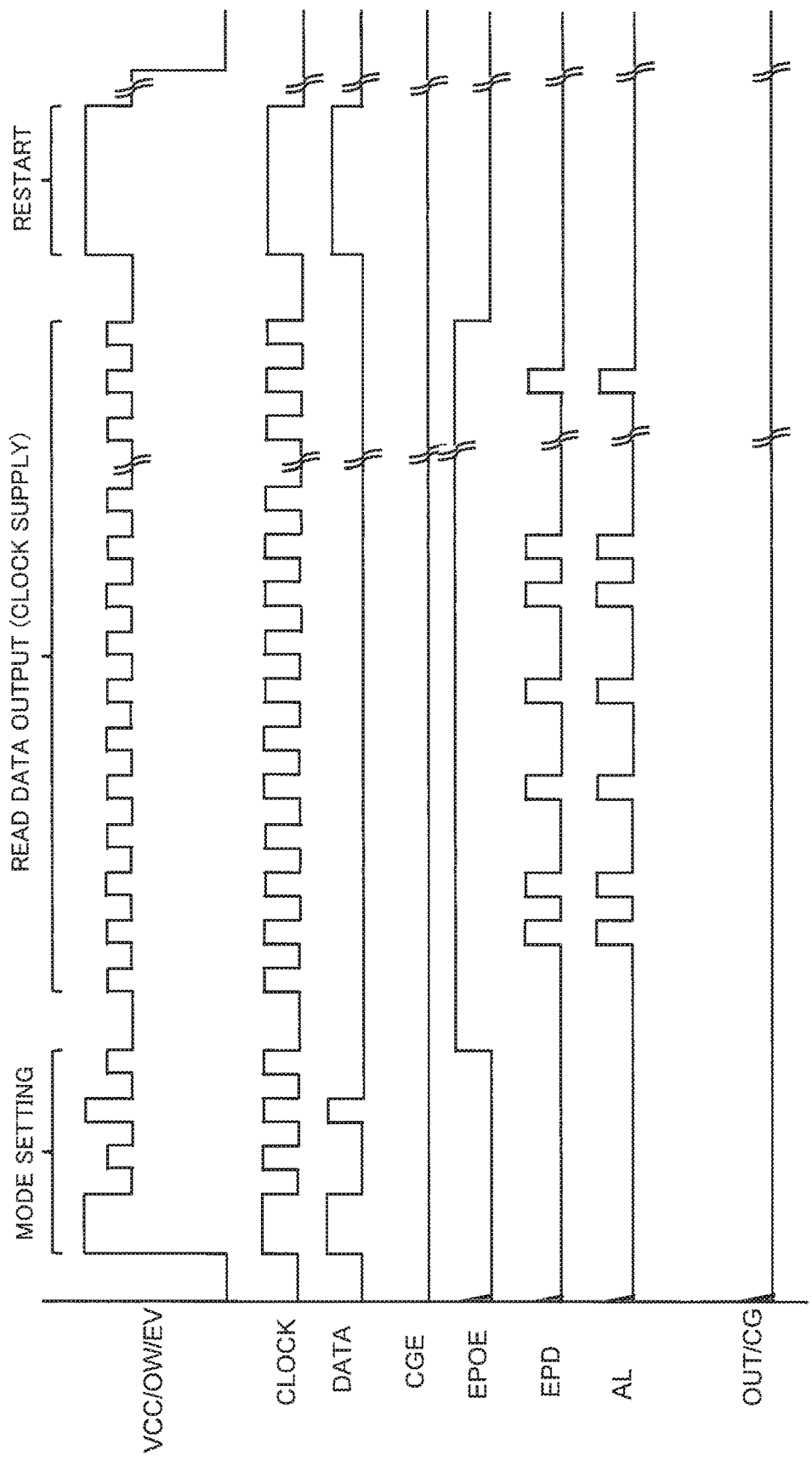

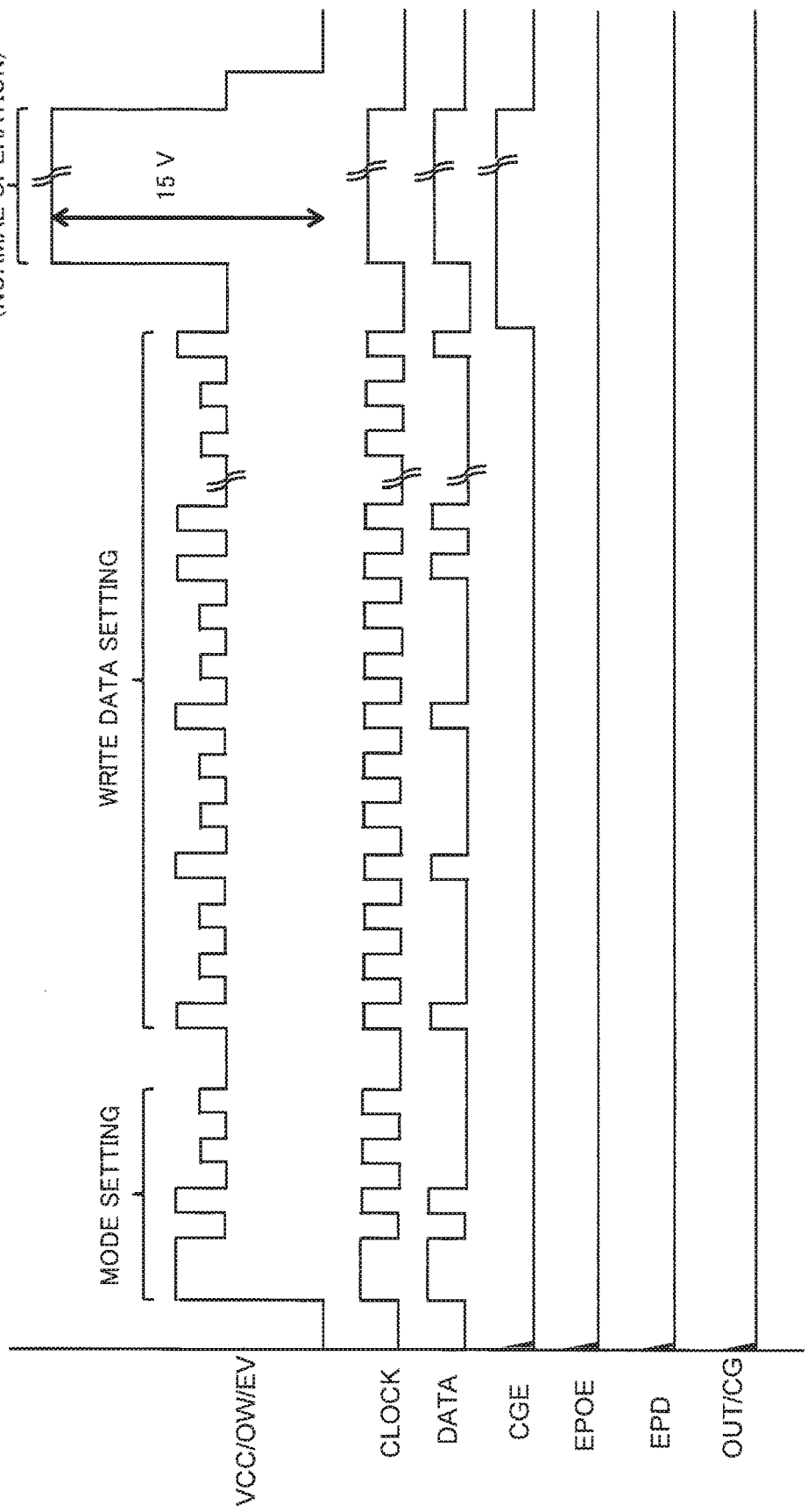

FIG. 19

| OPERATION MODE | | SWITCH | | | | | | | | | SIGNAL | | |
|---|---|---|---|---|---|---|---|---|---|---|---|---|---|
| | | SW1 | | SW2 | | SW3 | | SW4 | | | VGC/OW/EV | OUT/CG | AL |
| | | C1CTL | STATE | UV | OW/EV | EPOE | AL | CGE | OUT/CG | CG | | | |
| NORMAL | MODE SETTING/ EXECUTION/ SHIFT/ ANALOG MEASURE- MENT/ RESTART | ON | C1 CONNECTED | 0 OR 1 | GND OR VCC | 0 | ALD | 0 | DRV CONTROL | Hi-Z | VCC OPERATION 0V~15V NO PULSE | OUT OPERATION 0V~15V DEPENDENCE ON DRV CONTROL | ALD OUTPUT |
| EPROM TRIMMING | | OFF OR (ON) | C1 DISCONNECTED OR (C1 CONNECTED) | 1 | VCC (OW PULSE) | 1 | EPD | 0 | DITTO | DITTO | OW OPERATION 6V<OW<13V PULSE INPUT | DITTO | EPD OUTPUT |
| | WRITE | DITTO | DITTO | DITTO | VCC (EV PULSE) | DITTO | DITTO | 1 | 18 V INPUT (CG PULSE) | 18 V OUTPUT | EV OPERATION 9.5 V APPLIED | CG OPERATION 18 V APPLIED | DITTO |

SEMICONDUCTOR DEVICE

CROSS-REFERENCE TO RELATED APPLICATION

This application is a continuation application of International Application PCT/JP2017/016730 filed on Apr. 27, 2017, which designated the U.S. and claimed priority to Japanese Patent Application No. 2016-111851, filed on Jun. 3, 2016, the entire contents of which are incorporated herein by reference.

BACKGROUND OF THE INVENTION

1. Field of the Invention

The embodiments discussed herein are related to a semiconductor device.

2. Background of the Related Art

In recent years the development of semiconductor devices referred to as intelligent power modules (IPMs) and incorporating a power semiconductor element, such as an insulated gate bipolar transistor (IGBT), and a drive circuit which drives the power semiconductor element has progressed. IPMs are widely used in industrial apparatus, household appliances, and the like.

In order to improve the performance and reliability of an IPM, tests are carried out to check the quality, the performance, and the like. In this case, a command is transmitted from a test apparatus to a drive circuit of the IPM and a response returned from the drive circuit is received by the test apparatus. That is to say, two-way communications are performed between the drive circuit and the test apparatus.

The drive circuit of the IPM incorporates a memory. Set data and the like transmitted from the test apparatus are stored in the memory. Furthermore, set data stored in the memory is rewritten via the test apparatus to correct a set value. That is to say, trimming is performed. By doing so, an electrical property value of an IGBT is adjusted. For example, the current characteristic or the temperature characteristic of the IGBT is adjusted.

Formerly, for example, the following trimming technique was proposed. Trimming data is gradually changed and a sensor output is measured. Trimming data which sets the sensor output to a desired value is settled and stored. The sensor output is adjusted by the use of the stored trimming data (see, for example, Japanese Laid-open Patent Publication No. 2002-310735).

Furthermore, for example, the following technique was formerly proposed as a single-wire two-way communication technique. A first device transmits to a second device a clock signal which repeats a first level and an intermediate level. The second device transmits to the first device information indicative of whether or not the second device outputs a second level in a period for which the clock signal is at the intermediate level (see, for example, Japanese Laid-open Patent Publication No. 2012-169746). In addition, the technique of supplying a memory write voltage from a terminal used both for an input and for an output was proposed (see, for example, Japanese Laid-open Patent Publication No. 02-122497).

If the above trimming is performed, a dedicated external terminal is conventionally disposed on a semiconductor chip in order that a test apparatus writes data to and reads out data from a memory formed in the semiconductor chip.

However, in order to dispose the dedicated external terminal, a pad for the external terminal is newly formed and wire bonding is performed. This leads to an increase in the size of the semiconductor chip and an increase in the manufacturing costs.

SUMMARY OF THE INVENTION

According to an aspect, there is provided a semiconductor device including a first control circuit having a monitoring section which receives a voltage signal in which a pulse signal having a plurality of different voltage levels is superimposed on a power source voltage, which monitors a level of the voltage signal, and which outputs a monitoring result and a regulator which generates an internal voltage, a memory to which the internal voltage is supplied and which is used for trimming for adjusting an electrical property value, and a second control circuit to which the internal voltage is supplied, which reproduces a clock and data from the pulse signal on the basis of the monitoring result, and which performs the trimming by the use of the clock and the data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 11 illustrates an example of the function of a 3-bit command register;

FIG. 16 illustrates the waveform of the operation of writing to the EPROM;

FIG. 17 illustrates the waveform of the operation of reading out from the EPROM;

FIG. 18 illustrates a waveform obtained in the case of carrying out an adjustment by normal operation based on data set in the EPROM;

FIG. 19 is a table illustrative of relationships among operation modes, switches, and signals;

DETAILED DESCRIPTION OF THE INVENTION

Figure 1:
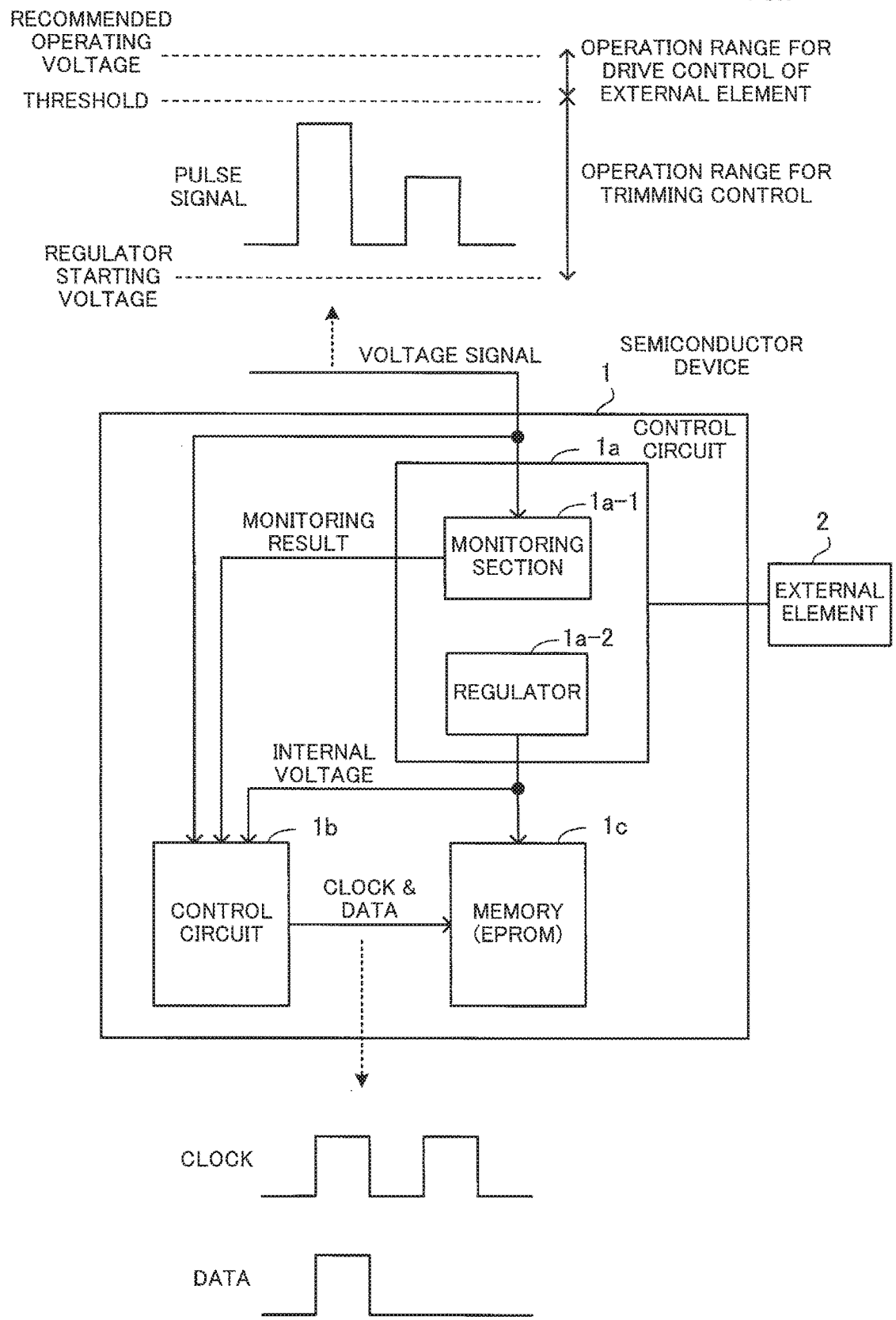
FIG. 1 illustrates an example of the structure of a semiconductor device.

Embodiments will now be described with reference to the accompanying drawings. FIG. 1 illustrates an example of the structure of a semiconductor device. A semiconductor device 1 includes a control circuit 1a (first control circuit), a control circuit 1b (second control circuit), and a memory 1c. Furthermore, an external element 2 (IGBT element, for example) is connected to the semiconductor device 1.

The control circuit 1a includes a monitoring section 1a-1 and a regulator 1a-2. The monitoring section 1a-1 receives a voltage signal in which a pulse signal having a plurality of different voltage levels is superimposed on a power source voltage, monitors a level of the voltage signal, and outputs a monitoring result. The regulator 1a-2 generates an internal voltage.

The internal voltage is supplied from the regulator 1a-2 to the memory 1c. The memory 1c is used for trimming for adjusting an electrical property value. The memory 1c is, for example, an erasable programmable read only memory (EPROM).

The internal voltage is supplied from the regulator 1a-2 to the control circuit 1b. The control circuit 1b reproduces a clock and data from the pulse signal on the basis of the monitoring result and performs trimming on the memory 1c by the use of the clock and the data.

The monitoring section 1a-1 has a threshold. The monitoring section 1a-1 recognizes a range where a level of the voltage signal exceeds the threshold as an operation range for drive control of the external element 2. Furthermore, the monitoring section 1a-1 recognizes a range where a level of the voltage signal is in the range of a starting voltage of the regulator 1a-2 to the threshold as an operation range for trimming control of the memory 1c.

Therefore, if a level of the voltage signal exceeds the threshold (if a level of the voltage signal exceeds the threshold and does not exceed a recommended operating voltage of the semiconductor device 1), then the control circuit 1a performs drive control of the external element 2. Furthermore, if a level of the voltage signal (pulse signal) is in the range of the starting voltage of the regulator 1a-2 to the threshold, then the control circuit 1b performs trimming on the memory 1c.

As has been described, the clock and the data are reproduced from the voltage signal in which the pulse signal having the plurality of different voltage levels is superimposed on the power source voltage. Then, drive control of the external element 2 or trimming control of the memory 1c is performed according to a level of the voltage signal.

As a result, there is no need to dispose an external terminal (such as a clock terminal or a data terminal) for performing trimming on the memory 1c. This suppresses an increase in circuit scale.

Figure 2:
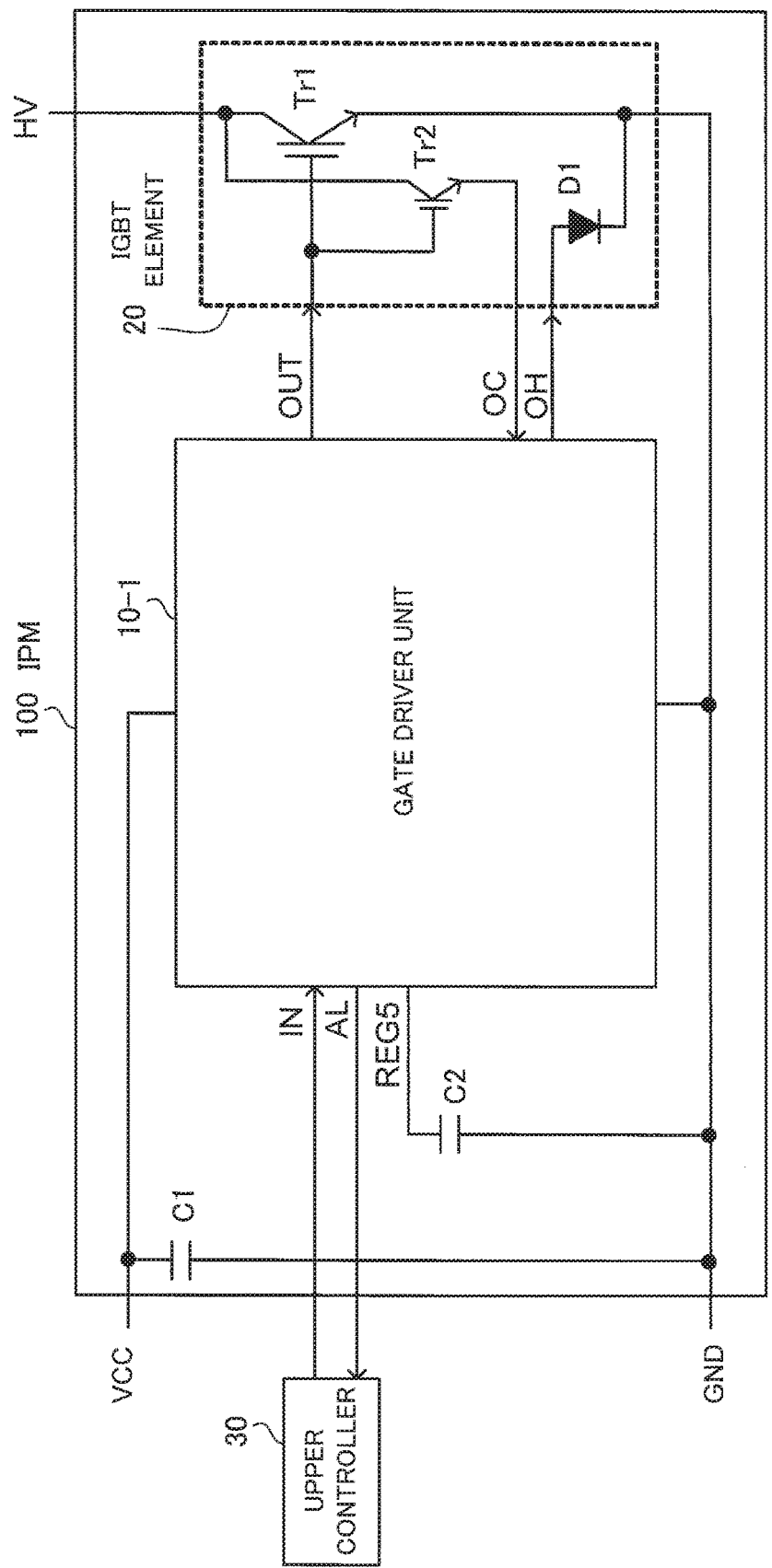
FIG. 2 illustrates an example of the structure of an IPM.

The rough structure of an IPM to which the semiconductor device 1 is applicable will now be described. FIG. 2 illustrates an example of the structure of an IPM. An IPM 100 includes a gate driver unit 10-1, an IGBT element 20, and capacitors C1 and C2. An upper controller 30 is connected to the gate driver unit 10-1. The upper controller 30 may be included in the IPM 100.

The gate driver unit 10-1 performs drive control of the IGBT element 20 on the basis of instructions from the upper controller 30. The upper controller 30 is, for example, a processor such as a microcomputer.

The bypass capacitor C1 is inserted between a power source voltage VCC supplied to the gate driver unit 10-1 and ground (hereinafter indicated by GND). Furthermore, the gate driver unit 10-1 generates an internal voltage of 5 volts (internal voltage REG5). The bypass capacitor C2 is inserted between the internal voltage REG5 and GND outside the gate driver unit 10-1.

The IGBT element 20 includes a main transistor Tr1, a sense transistor Tr2, and a diode D1. The main transistor Tr1 is for driving a load (not illustrated).

The sense transistor Tr2 is a current detection transistor for detecting a current flowing through the main transistor Tr1. The diode D1 is a temperature detection diode for detecting an operating temperature of the main transistor Tr1.

A gate drive signal OUT outputted from the gate driver unit 10-1 is inputted to a gate of the main transistor Tr1 and a gate of the sense transistor Tr2.

A collector of the main transistor Tr1 is connected to a high-side power supply HV and a collector of the sense transistor Tr2. A current detection signal OC outputted from an emitter of the sense transistor Tr2 is inputted to the gate driver unit 10-1.

A cathode of the diode D1 is connected to an emitter of the main transistor Tr1 and GND. Because the diode D1 is pulled up by the gate driver unit 10-1, a temperature detection signal OH (forward voltage of the diode D1 which changes according to the temperature) is generated at an anode of the diode D1.

Because the main transistor Tr1 is a power transistor for driving the load, a large current flows through the main transistor Tr1. Therefore, if the upper controller 30 is directly connected to the gate driver unit 10-1, the upper controller 30 may malfunction or break due to noise attendant on a current flowing through the main transistor Tr1.

Accordingly, an insulating element, such as a photocoupler or a pulse transformer, is used for preventing noise from transmitting to the upper controller 30. As a result, isolation of the upper controller 30 from the gate driver unit 10-1 is realized and the upper controller 30 is connected to the gate driver unit 10-1.

Overcurrent detection and overheat detection will now be described. On the basis of a control signal IN transmitted from the upper controller 30, the gate driver unit 10-1 outputs a gate drive signal OUT for turning on and off the main transistor Tr1 in the IGBT element 20.

When the main transistor Tr1 is turned on, a current flows through the main transistor Tr1. At this time a current proportional to the current flowing through the main transistor Tr1 flows through the sense transistor Tr2.

For example, a current ratio is set so that the current flowing through the sense transistor Tr2 will be 1 when the current flowing through the main transistor Tr1 is 100. The current flowing through the sense transistor Tr2 is inputted to the gate driver unit 10-1 as the current detection signal OC and overcurrent detection is performed by the gate driver unit 10-1.

Specifically, the gate driver unit 10-1 includes a detection resistor and the current detection signal OC is converted to a voltage by the detection resistor. An overcurrent of the main transistor Tr1 is detected by comparing the voltage after the conversion and a reference voltage.

On the other hand, overheat detection is performed in the following way. The diode D1 has a temperature characteristic. An anode voltage (temperature detection signal OH) of the diode D1 changes according to a change in the temperature. The gate driver unit 10-1 detects overheat caused by a change in the temperature of the main transistor Tr1 by detecting the anode voltage.

When the gate driver unit 10-1 detects any abnormality by the above overcurrent detection and overheat detection, the gate driver unit 10-1 transmits an alarm signal AL to the upper controller 30.

It is assumed that trimming is performed by a gate driver unit on which an external terminal is disposed. The structure of the gate driver unit and a problem which arises in that case will now be described.

Figure 3:
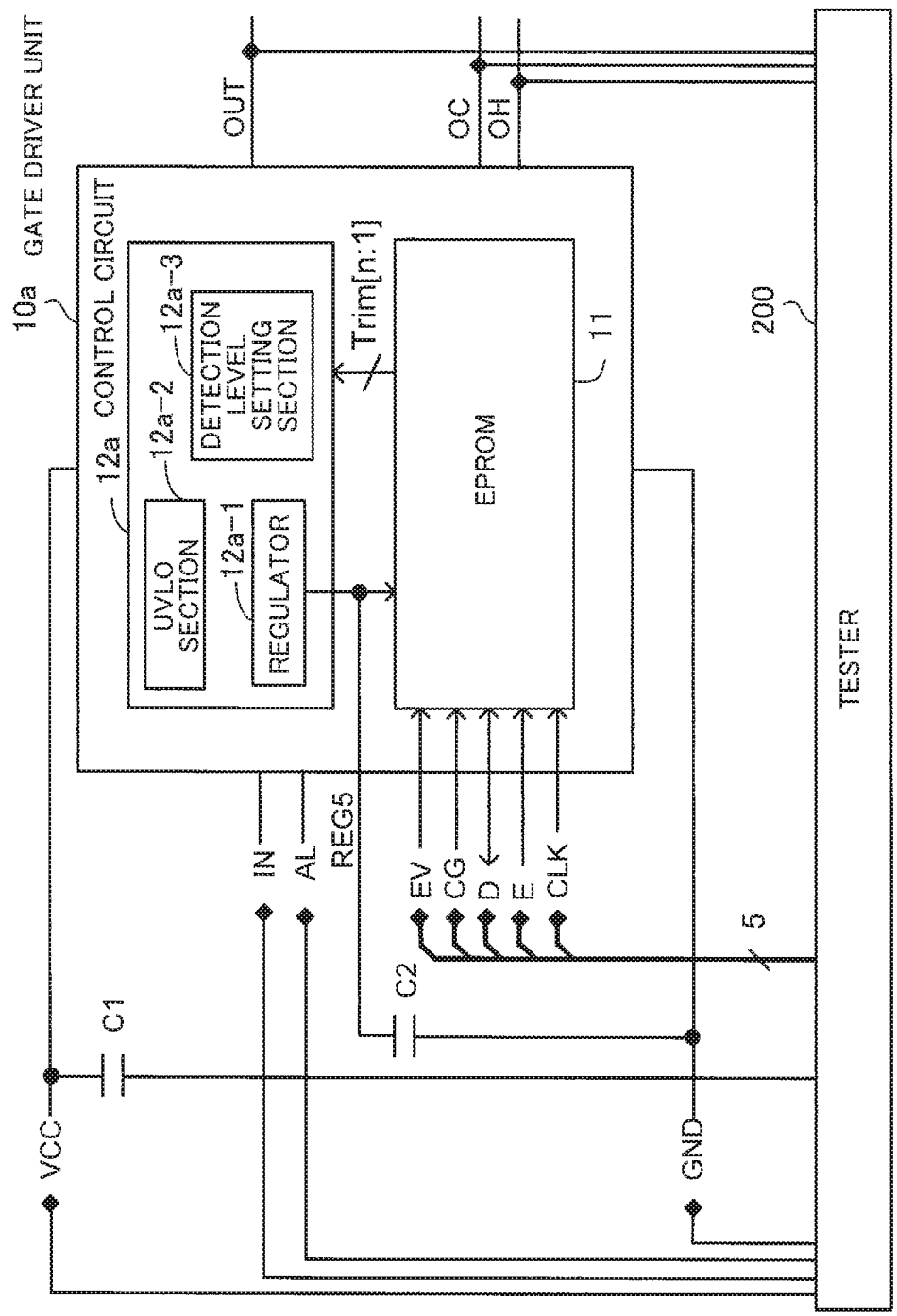
FIG. 3 illustrates an example of the structure of a gate driver unit on which an external terminal for trimming is disposed.

FIG. 3 illustrates an example of the structure of a gate driver unit on which an external terminal for trimming is disposed. A gate driver unit 10a includes an EPROM 11 and a control circuit 12a.

The control circuit 12a includes a regulator 12a-1, an under voltage lock out (UVLO) section 12a-2, and a detection level setting section 12a-3.

A tester (test apparatus) 200 is connected to the gate driver unit 10a. The tester 200 is capable of simulating the upper controller 30 illustrated in FIG. 2 and used for performing trimming and adjusting set data. An IGBT element 20 is not illustrated.

On the other hand, dedicated external terminals for controlling via the tester 200 the EPROM 11 for trimming are disposed on the gate driver unit 10a. In the example of FIG. 3, a terminal EV, a terminal CG, a data terminal D, an enable terminal E, and a clock terminal CLK are disposed as external terminals.

The terminal EV and the terminal CG are voltage application terminals used for writing data at trimming time to the EPROM 11 including a floating metal-oxide-semiconductor (MOS) array. When data is written, the tester 200 applies a voltage higher than a power source voltage VCC to the terminal EV and applies to the terminal CG a voltage for driving a floating gate.

The data terminal D is a multi-function terminal used for inputting data to be written to the EPROM 11 from the tester 200 or outputting data read out from the EPROM 11 to the tester 200. The enable terminal E is used for receiving an enable signal transmitted from the tester 200 and enabling the EPROM 11. The clock terminal CLK is used for supplying a clock signal from the tester 200 to the EPROM 11.

The EPROM 11 is used for trimming for increasing the accuracy of a detection level at the time of performing the above overcurrent detection or overheat detection. Furthermore, trim data Trim is outputted from the EPROM 11 to the control circuit 12a. The trim data Trim is n-bit control data by which instructions to change a detection level of overcurrent detection or overheat detection are given.

The regulator 12a-1 generates an internal voltage REG5 (of, for example, 5 volts) and supplies it to the EPROM 11. The UVLO section 12a-2 monitors a level of the power source voltage VCC supplied to the gate driver unit 10a.

The detection level setting section 12a-3 generates a signal for performing drive control of the IGBT element 20. Furthermore, when the detection level setting section 12a-3 recognizes the trim data Trim outputted from the EPROM 11, the detection level setting section 12a-3 adjusts a detection level at the time of trimming of overcurrent detection or overheat detection and sets it to a proper value.

At the time of trimming of overcurrent detection, for example, the following operation is performed. An adjustment is carried out by shifting a threshold of an overcurrent detection level on the basis of a set value of the trim data Trim in order to correctly detect whether or not a main transistor Tr1 is in an overcurrent state from a current flowing through the main transistor Tr1.

Furthermore, at the time of trimming of overheat detection, the following operation is performed. An adjustment is carried out by shifting a threshold of an overheat detection level on the basis of a set value of the trim data Trim in order to correctly detect whether or not the main transistor Tr1 is in an overheat state from an operating temperature of the main transistor Tr1.

In addition, the detection level setting section 12a-3 outputs a signal indicative of whether or not the IGBT element 20 is in an overcurrent or overheat state. This signal is outputted as an alarm signal AL from the gate driver unit 10a to the tester 200.

The tester 200 accesses the EPROM 11 and performs trimming by the use of the above external terminals, while monitoring the alarm signal AL outputted from the gate driver unit 10a. By doing so, the tester 200 performs setting so that a detection level will finally fall within a target.

Problems with the structure illustrated in FIG. 3 will be described. As stated above, with the gate driver unit 10a illustrated in FIG. 3, there is a need to prepare dedicated external terminals for controlling the EPROM 11 used for trimming (in the example of FIG. 3, the five dedicated external terminals are prepared). However, in order to make connections to external terminals, as many pads as the external terminals are formed and wire bonding is performed. This leads to an increase in the size of a semiconductor chip and an increase in the manufacturing costs.

In addition, usually an IPM includes plural IGBT elements. As a result, plural gate driver units are included according to the number of IGBT elements. Therefore, if plural external terminals are disposed on each gate driver unit, a circuit scale significantly increases.

Moreover, with the structure of FIG. 3 in which external terminals are needed, it may be impossible to dispose a sufficient number of external terminals from the viewpoint of, for example, mounting. In such a case, it is difficult to perform trimming.

On the other hand, according to the above Japanese Laid-open Patent Publication No. 02-122497, for example, a memory write voltage is supplied from a terminal used both for an input and for an output. However, nothing is described about how to switch this terminal to a write voltage input terminal and a normal input-output terminal. Furthermore, nothing is described about how a write voltage is handled in an input-output circuit. It is not clear that one terminal may actually carry out a write function and an output function.

In the present disclosure, there is provided a semiconductor device in which the number of dedicated external terminals is reduced or external terminals are eliminated, which communicates with an external apparatus such as a tester, and in which an increase in circuit scale is suppressed.

The structure and operation of a gate driver unit to which the technique according to the present disclosure is applied will now be described in detail.

Figure 4:
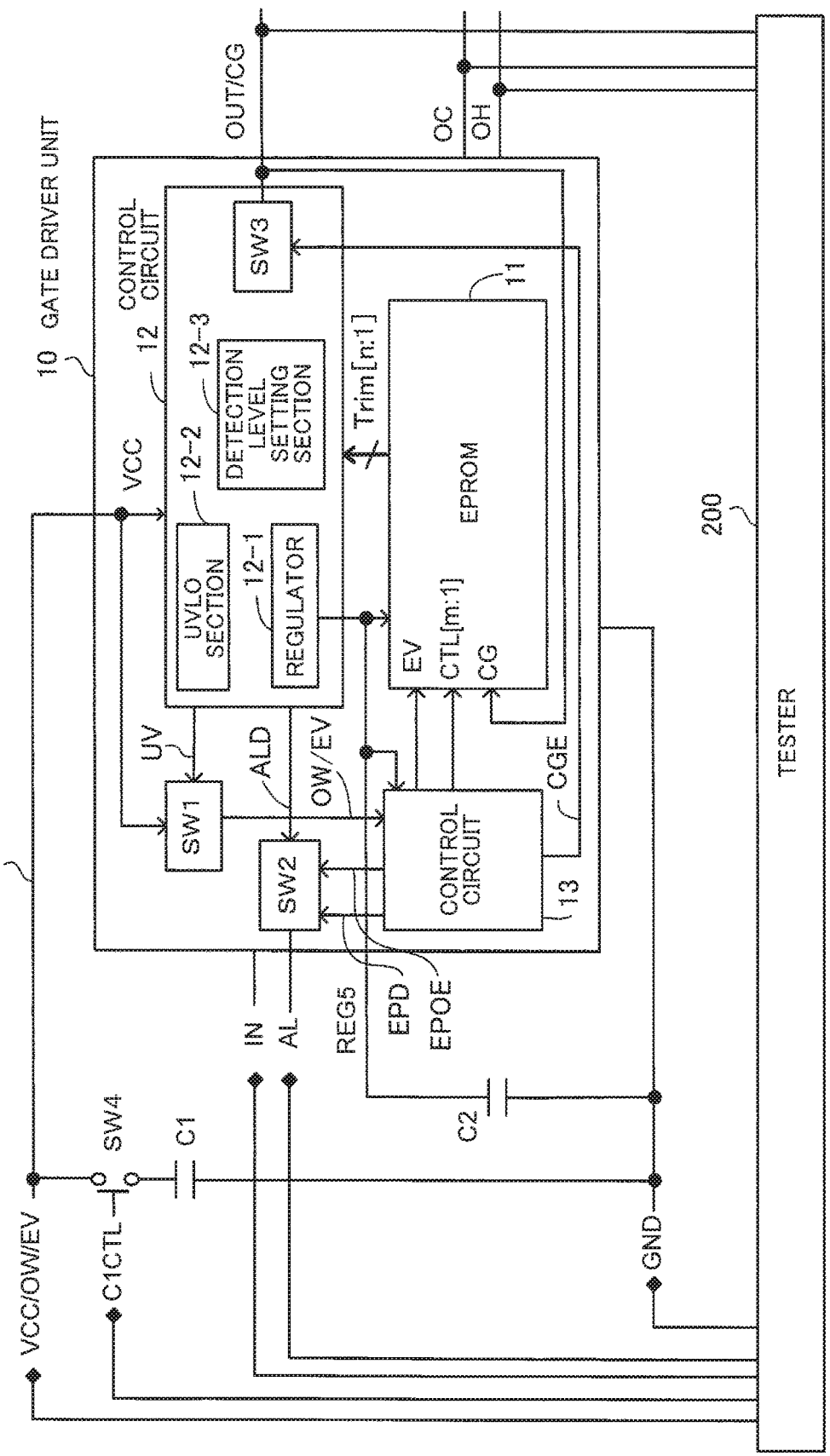
FIG. 4 illustrates an example of the structure of a gate driver unit according to the present disclosure.

FIG. 4 illustrates an example of the structure of a gate driver unit according to the present disclosure. A gate driver unit 10 according to the present disclosure includes an EPROM 11, control circuits 12 and 13, a switch SW1 (first switch), and a switch SW2 (second switch). With the gate driver unit 10 according to the present disclosure, dedicated external terminals for trimming are unnecessary. An IGBT element 20 is not illustrated.

The control circuit 12 includes a regulator 12-1, a UVLO section 12-2, a detection level setting section 12-3, and a switch SW3 (third switch). The control circuit 12 corresponds to the control circuit 1a illustrated in FIG. 1.

The regulator 12-1 and the UVLO section 12-2 correspond to the regulator 1a-2 and the monitoring section 1a-1, respectively, illustrated in FIG. 1. Furthermore, the detection level setting section 12-3 has the same function as the detection level setting section 12a-3 illustrated in FIG. 3 has.

The control circuit 13 corresponds to the control circuit 1b illustrated in FIG. 1 and performs control of the EPROM 11 needed for trimming.

On the basis of a level of a signal UV outputted from the UVLO section 12-2, the switch SW1 performs switching for switching a level of a signal OW/EV and outputs it to the control circuit 13.

On the basis of a level of a signal EPOE outputted from the control circuit 13, the switch SW2 performs switching between alarm data ALD outputted from the control circuit 12 and memory data EPD outputted from the control circuit 13 and outputs one of them as an alarm signal AL.

On the basis of a signal CGE outputted from the control circuit 13, the switch SW3 switches a terminal OUT/CG between an output terminal and an input terminal.

On the other hand, a switch SW4 (fourth switch) is disposed outside the gate driver unit 10. One end of the switch SW4 is connected to a line L1 to which a signal VCC/OW/EV corresponding to the voltage signal illustrated in FIG. 1 is applied. The other end of the switch SW4 is connected to one end of a capacitor C1. The other end of the capacitor C1 is connected to GND. The switch SW4 performs switching on the basis of a signal C1CTL (external instructions) from a tester 200 (details will be described later).

Figure 5:
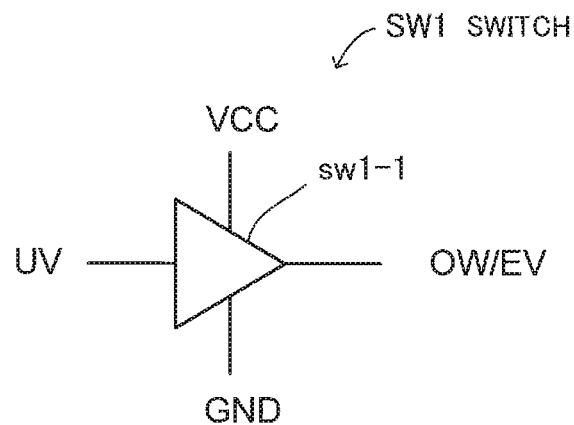
FIG. 5 illustrates an example of the structure and function of a first switch.

The structure and switching function of each of the switches SW1 through SW3 will now be described. FIG. 5 illustrates an example of the structure and function of the first switch. A main circuit of the switch SW1 is a selector sw1-1.

The signal UV (monitoring result) outputted from the UVLO section 12-2 is inputted to the selector sw1-1. The selector sw1-1 outputs a power source voltage VCC or GND according to a level of the signal UV to switch an output level of the signal OW/EV (switching signal).

As stated above, the UVLO section 12-2 monitors a level of the power source voltage VCC. Specifically, the UVLO section 12-2 compares the power source voltage VCC and a threshold (UVLO threshold) which the UVLO section 12-2 has, and outputs a comparison result as the signal UV.

It is assumed that a level of the power source voltage VCC (voltage level for driving the IGBT element 20) at normal operation time (at the time of the operation of gate drive of the IGBT element 20 by the gate driver unit 10) is 15 V. Furthermore, it is assumed that a regulator starting voltage which the regulator 12-1 needs for starting and outputting an internal voltage REG5 of 5 volts is 6 V. In addition, it is assumed that the UVLO threshold is 13 V.

When the power source voltage VCC is higher than or equal to 13 V, the UVLO section 12-2 determines to perform the operation of gate drive of the IGBT element 20 by the gate driver unit 10, sets the signal UV to 0 level, and outputs it (outputs a first monitoring result).

Furthermore, when the power source voltage VCC is between 6 and 13 V, the UVLO section 12-2 determines to stop the operation of gate drive of the IGBT element 20, sets the signal UV to 1 level, and outputs it (outputs a second monitoring result). When the power source voltage VCC is between 6 and 13 V, the operation of gate drive of the IGBT element 20 by the gate driver unit 10 is stopped. However, when the power source voltage VCC is between 6 and 13 V, trimming is performed on the EPROM 11.

If the signal UV is at the 0 level (if the gate drive operation is performed), then the switch SW1 outputs GND as the signal OW/EV. The GND outputted from the switch SW1 is a stop signal for stopping trimming.

Furthermore, if the signal UV is at the 1 level (if the gate drive operation is stopped and a trimming operation is performed on the EPROM 11), then the switch SW1 outputs the power source voltage VCC (=6 to 13 V) as the signal OW/EV. The power source voltage VCC outputted at this time corresponds to the pulse signal illustrated in FIG. 1.

Figure 6:
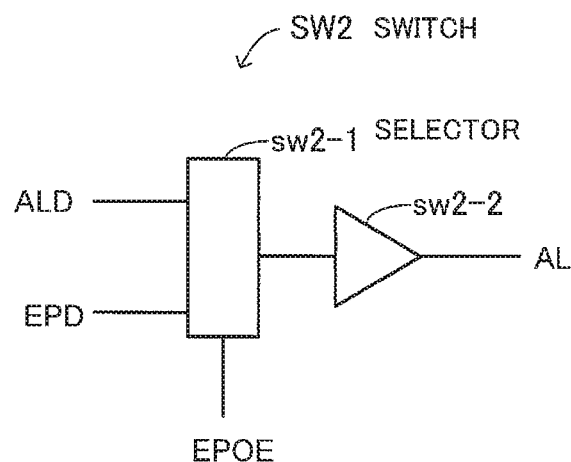
FIG. 6 illustrates an example of the structure and function of a second switch.

FIG. 6 illustrates an example of the structure and function of the second switch. The switch SW2 includes a selector sw2-1 and a buffer sw2-2. The alarm data ALD outputted from the control circuit 12 and the memory data EPD outputted from the control circuit 13 are inputted to the selector sw2-1. Furthermore, the signal EPOE outputted from the control circuit 13 is inputted to the selector sw2-1.

For example, the alarm data ALD is a signal indicative of whether or not the IGBT element 20 is in an overcurrent or overheat state. Whether or not the IGBT element 20 is in an overcurrent or overheat state is recognized by the detection level setting section 12-3 in the control circuit 12.

Furthermore, the memory data EPD is data read out at trimming time from the EPROM 11. The data read out from the EPROM 11 is outputted as the memory data EPD via the control circuit 13.

The selector sw2-1 switches its output between the alarm data ALD and the memory data EPD according to a level of the signal EPOE as a select signal. Furthermore, a signal from the selector sw2-1 is outputted as the alarm signal AL via the buffer sw2-2.

If the control circuit 13 receives the signal OW/EV outputted from the switch SW1 and recognizes it as the GND, that is to say, if the power source voltage VCC is higher than or equal to 13 V, then the control circuit 13 sets the signal EPOE to 0 level (low level) (first select signal).

When the signal EPOE is at the 0 level, the switch SW2 selects the alarm data ALD and outputs as the alarm signal AL the alarm data ALD outputted from the control circuit 12. That is to say, the alarm data ALD is outputted as the alarm signal AL at normal operation time at which the power source voltage VCC is higher than or equal to 13 V.

Furthermore, if the control circuit 13 receives the signal OW/EV outputted from the switch SW1 and recognizes it as the power source voltage VCC which is between 6 and 13 V, then the control circuit 13 sets the signal EPOE to 1 level (high level) (second select signal).

When the signal EPOE is at the 1 level, the switch SW2 selects the memory data EPD and outputs as the alarm signal AL the memory data EPD outputted from the control circuit 13. That is to say, if the power source voltage VCC is in the range of 6 to 13 V and is a voltage at trimming time, then the memory data EPD read out from the EPROM 11 is outputted as the alarm signal AL.

As has been described, if the power source voltage VCC is higher than or equal to 13 V (at gate drive time), the alarm data ALD is outputted as the alarm signal AL from a single terminal. Furthermore, if the power source voltage VCC is in the range of 6 to 13 V (at trimming time), the memory data EPD is outputted as the alarm signal AL from the same terminal.

Figure 7:
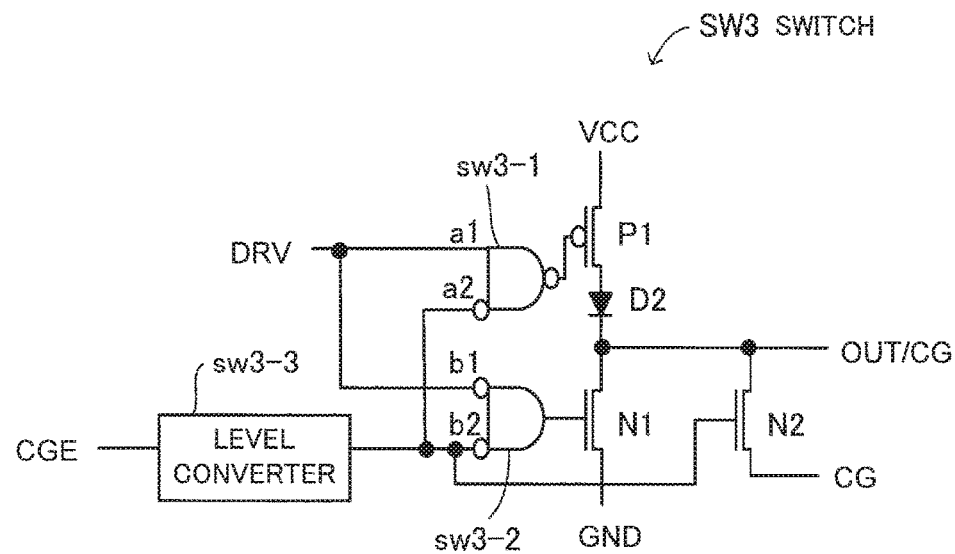
FIG. 7 illustrates an example of the structure and function of a third switch.

FIG. 7 illustrates an example of the structure and function of the third switch. The switch SW3 includes logic elements sw3-1 and sw3-2, a level converter sw3-3, a p-channel metal-oxide semiconductor (PMOS) transistor P1, n-channel MOS (NMOS) transistors N1 and N2, and a diode D2.

The logic element sw3-1 is a logic element with two inputs and one output. If one input a1 is at an H level and the other input a2 is at an L level, the logic element sw3-1 outputs an L level. In the other cases, the logic element sw3-1 outputs an H level. The logic element sw3-2 is a logic element with two inputs and one output. If both of the two inputs are at an L level, the logic element sw3-2 outputs an H level. In the other cases, the logic element sw3-2 outputs an L level.

Each element is connected in the following way. A drive signal DRV is inputted to a positive logic input terminal a1 of the logic element sw3-1 and a negative logic input terminal b1 of the logic element sw3-2. The drive signal DRV corresponds to a gate drive signal flowing in the control circuit 12.

A signal CGE (write setting signal) generated in the control circuit 13 is inputted to an input end of the level converter sw3-3. An output end of the level converter sw3-3 is connected to a negative logic input terminal a2 of the logic element sw3-1, a negative logic input terminal b2 of the logic element sw3-2, and a gate of the NMOS transistor N2.

An output terminal of the logic element sw3-1 is connected to a gate of the PMOS transistor P1. An output terminal of the logic element sw3-2 is connected to a gate of the NMOS transistor N1.

The power source voltage VCC is inputted to a source of the PMOS transistor P1. A drain of the PMOS transistor P1 is connected to an anode of the diode D2. A cathode of the diode D2 is connected to a drain of the NMOS transistor N1, a drain of the NMOS transistor N2, and a terminal OUT/CG. A source of the NMOS transistor N2 is connected to a terminal CG of the EPROM 11.

When the terminal OUT/CG is used in an output mode (as an output terminal) (when the gate driver unit 10 performs normal operation), the control circuit 13 sets the signal CGE to 0 level (GND) and outputs it.

Furthermore, when the terminal OUT/CG is used in an input mode (as an input terminal) (when data is written to the EPROM 11 in trimming), the control circuit 13 sets the signal CGE to 1 level (internal voltage REG5) and outputs it.

When the signal CGE is at the 0 level and the output mode is set (when the write setting signal is in an off state), the NMOS transistor N2 is in an off state and the terminal OUT/CG is used as an output terminal. At this time, a value of the drive signal DRV is 0 (GND) or 1 (VCC) and 0 (GND) or 1 (VCC) is outputted as a gate drive signal OUT from the terminal OUT/CG. Furthermore, at this time a signal CG is in a high-impedance state.

On the other hand, when the signal CGE is at the 1 level and the input mode is set (when the write setting signal is in an on state), the PMOS transistor P1 is in an off state, the NMOS transistor N1 is in an off state, the NMOS transistor N2 is in an on state, and the terminal OUT/CG is used as an input terminal. A value of the drive signal DRV is indefinite and a voltage of 18 volts is inputted from the tester 200 to the terminal OUT/CG. At this time, the signal CG has a voltage of 18 volts and this voltage is applied to the terminal CG of the EPROM 11.

The diode D2 included in the switch SW3 prevents a short circuit between a voltage applied to the terminal OUT/CG and the power source voltage VCC.

That is to say, if a voltage applied to the terminal OUT/CG is higher than the power source voltage VCC, a short circuit occurs between the voltage applied to the terminal OUT/CG and the power source voltage VCC via a parasitic diode of the PMOS transistor P1. Therefore, the diode D2 is disposed to prevent a short circuit between the voltage applied to the terminal OUT/CG and the power source voltage VCC.

Furthermore, the 1 level of the signal CGE outputted from the control circuit 13 corresponds to an internal voltage REG5 of 5 volts. However, each element included in the switch SW3 operates at the power source voltage VCC higher than the internal voltage REG5. Therefore, the level converter sw3-3 is disposed to raise the voltage level of the signal CGE to the power source voltage VCC.

Figure 8:
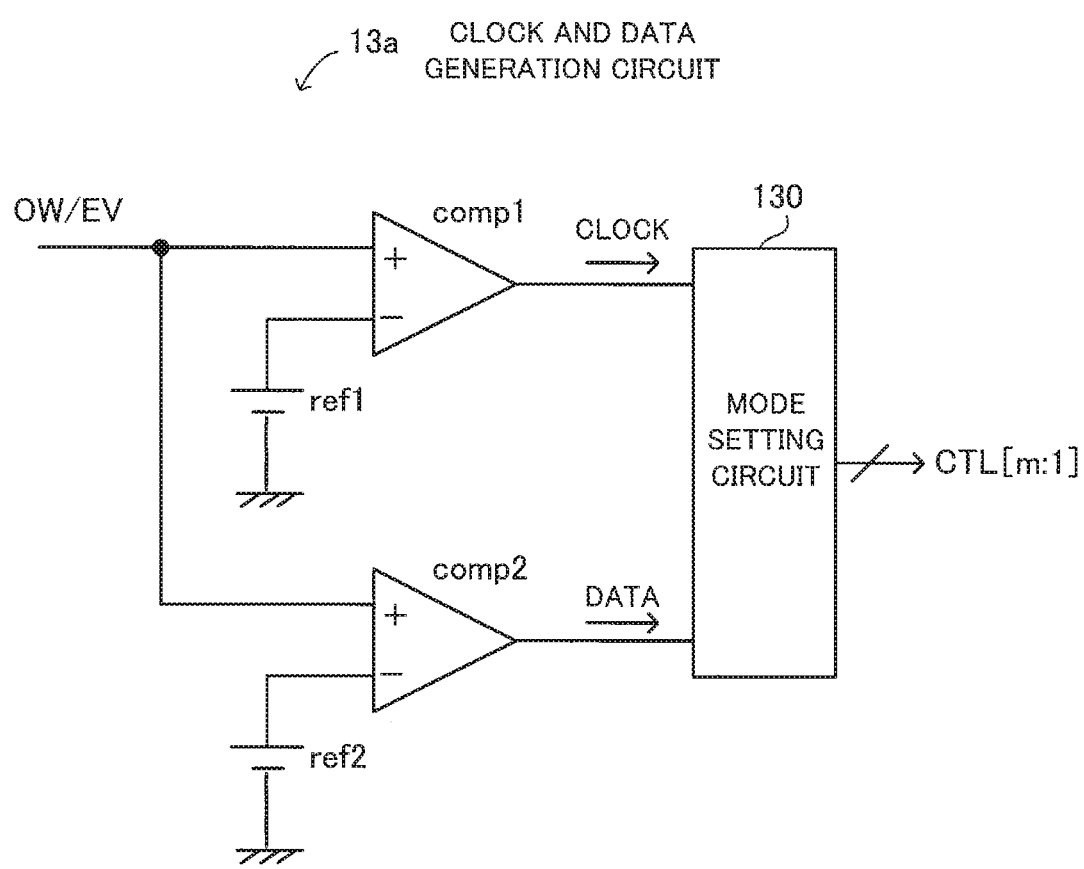
FIG. 8 illustrates an example of the structure of a clock and data generation circuit.

The structure of a clock and data generation circuit will now be described. FIG. 8 illustrates an example of the structure of a clock and data generation circuit. A clock and data generation circuit 13a is included in the control circuit 13. The clock and data generation circuit 13a includes comparators comp1 and comp2, reference power sources ref1 and ref2, and a mode setting circuit 130. The clock and data generation circuit 13a generates from one signal OW/EV a clock and data for controlling the EPROM 11.

In this case, the clock and data generation circuit 13a reproduces a clock and data superimposed in the signal OW/EV and generates from the clock and the data a mode setting control signal CTL for setting a mode of the EPROM 11.

The signal OW/EV is inputted to a positive side input end (+) of the comparator comp1 and a positive side input end (+) of the comparator comp2. One end of the reference power source ref1 is connected to a negative side input end (−) of the comparator comp1. The other end of the reference power source ref1 is connected to the GND. One end of the reference power source ref2 is connected to a negative side input end (−) of the comparator comp2. The other end of the reference power source ref2 is connected to the GND.

The clock is outputted from an output end of the comparator comp1. The data is outputted from an output end of the comparator comp2. The clock and the data are inputted to the mode setting circuit 130. The mode setting circuit 130 generates an m-bit mode setting control signal CTL on the basis of the clock and the data inputted and inputs it to a terminal CTL[m:1] of the EPROM 11 (mode setting control signal CTL includes an enable signal of the EPROM 11).

Figure 9:
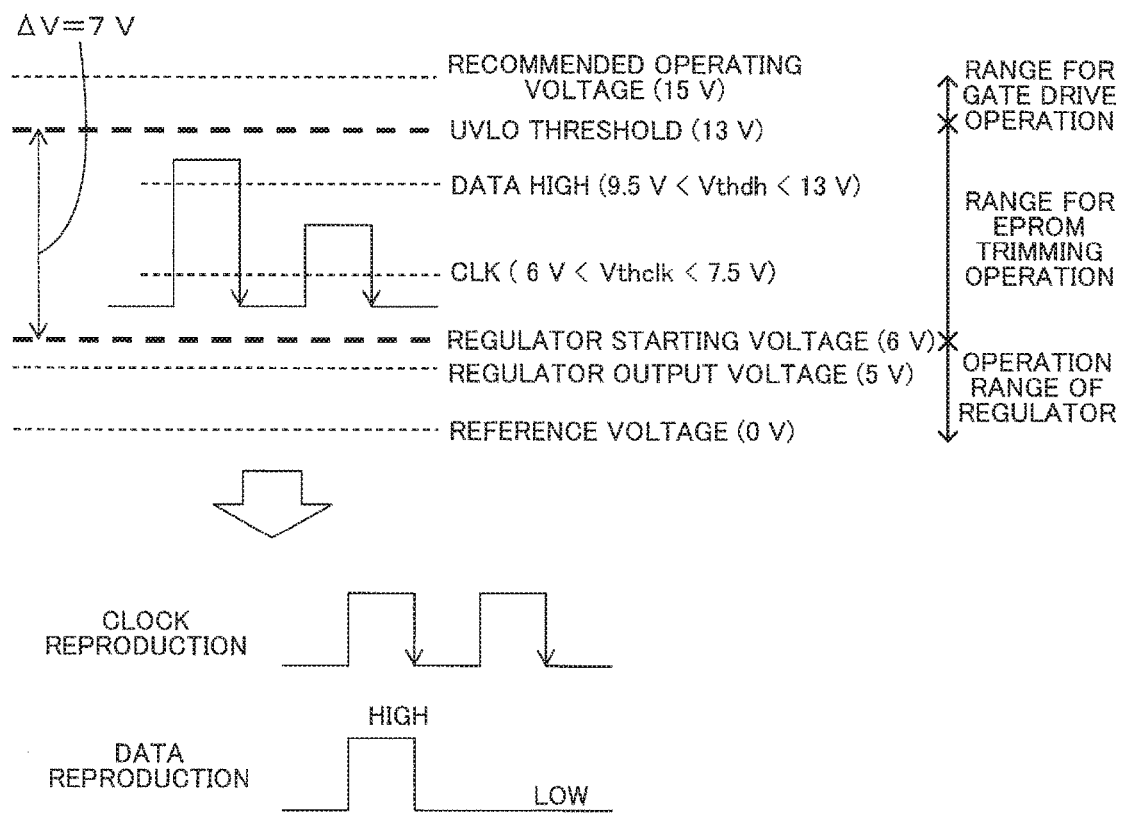
FIG. 9 illustrates amplitude modulation of a signal OW/EV and clock and data reproduction.

FIG. 9 illustrates amplitude modulation of a signal OW/EV and clock and data reproduction. A signal OW/EV, of a signal VCC/OW/EV transmitted from the tester 200, used for trimming is obtained by superimposing by amplitude modulation voltages at three levels (low, middle, and high levels) by which a clock and data may be identified.

Because the range of a trimming operation (operation range of the EPROM 11) is 6 V (regulator starting voltage) to 13 V (UVLO threshold), the signal OW/EV also varies in the range of 6 to 13 V.

An H level of the clock superimposed in the signal OW/EV varies in the range of 6 to 7.5 V. It is assumed that a reference voltage generated by the reference power source ref1 is Vthclk. If the clock and data generation circuit 13a illustrated in FIG. 8 reproduces the clock, then the reference voltage Vthclk is set so as to satisfy 6 V<Vthclk<7.5 V.

Furthermore, the comparator comp1 of the clock and data generation circuit 13a reproduces and outputs the clock on the basis of a result obtained by comparing the signal OW/EV and the reference voltage Vthclk generated by the reference power source ref1.

In addition, an H level of the data superimposed in the signal OW/EV varies in the range of 9.5 to 13 V. It is assumed that a reference voltage generated by the reference power source ref2 is Vthdh. If the clock and data generation circuit 13a illustrated in FIG. 8 reproduces the data, then the reference voltage Vthdh is set so as to satisfy 9.5 V<Vthdh<13 V.

Furthermore, the comparator comp2 of the clock and data generation circuit 13a reproduces and outputs the data on the basis of a result obtained by comparing the signal OW/EV and the reference voltage Vthdh generated by the reference power source ref2.

The range of 0 V to 6 V (regulator starting voltage) is the operation range of the regulator 12-1. The range of 13 V (UVLO threshold) to 15 V (recommended operating voltage) is the range of the gate drive operation of the gate driver unit 10.

Figure 10:
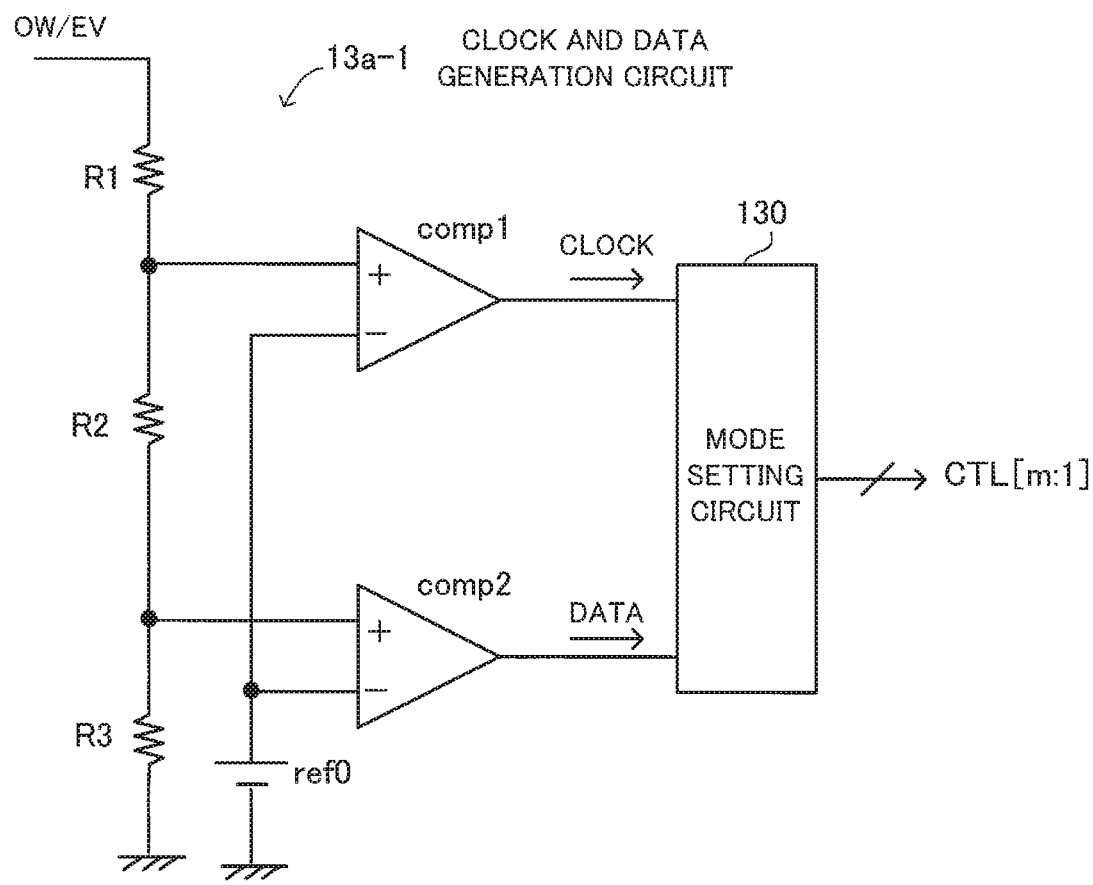
FIG. 10 illustrates another example of the structure of a clock and data generation circuit.

FIG. 10 illustrates another example of the structure of a clock and data generation circuit. With the clock and data generation circuit 13a illustrated in FIG. 8, the input level of the signal OW/EV is common to the clock and the data, the different reference power sources are used for the clock and the data, and level comparisons are made.

On the other hand, in the example of FIG. 10, the input level of a signal OW/EV is converted to two levels for a clock and data by division with resistors and a common reference power source is used for making level comparison.

A clock and data generation circuit 13a-1 includes resistors R1 through R3, comparators comp1 and comp2, and a reference power source ref0.

A signal OW/EV is inputted to one end of the resistor R1. The other end of the resistor R1 is connected to a positive side input end (+) of the comparator comp1 and one end of the resistor R2. The other end of the resistor R2 is connected to a positive side input end (+) of the comparator comp2 and one end of the resistor R3. The other end of the resistor R3 is connected to GND.

A negative side input end (−) of the comparator comp1 is connected to a negative side input end (−) of the comparator comp2 and one end of the reference power source ref0. The other end of the reference power source ref0 is connected to the GND.

A clock is outputted from an output end of the comparator comp1. Data is outputted from an output end of the comparator comp2. The clock and the data are inputted to the mode setting circuit 130. By adopting this structure, the clock and the data are reproduced in the same way that is illustrated in FIG. 8.

Mode setting performed by the mode setting circuit 130 will now be described. The mode setting circuit 130 includes a 3-bit command register (mode setting register). The 3-bit command register uses a determined number of clocks for analyzing a 3-bit command transmitted from the tester 200 and performing mode setting.

FIG. 11 illustrates an example of the function of the 3-bit command register. A table T1 indicates the function of a 3-bit command register value. No. 2, No. 6, and No. 7 are empty.

In the case of No. 1, Name is "output". When the command "000" is transmitted from the tester 200, the mode setting circuit 130 outputs serial data.

In the case of No. 3, Name is "reference". When the command "010" is transmitted from the tester 200, the mode setting circuit 130 sets the contents of the EPROM 11 in a shift register (S.R.) which is an auxiliary memory. The shift register (S.R.) is included in the mode setting circuit 130.

In the case of No. 4, Name is "adjustment". When the command "011" is transmitted from the tester 200, the mode setting circuit 130 outputs the logical sum (OR) of the contents of the shift register (S.R.) and the contents of the EPROM 11.

In the case of No. 5, Name is "write". When the command "100" is transmitted from the tester 200, the mode setting circuit 130 writes the contents of the shift register (S.R.) to the EPROM 11.

In the case of No. 8, Name is "reset". When the command "111" is transmitted from the tester 200, the mode setting circuit 130 resets the shift register (S.R.) and mode setting.

Figure 12:
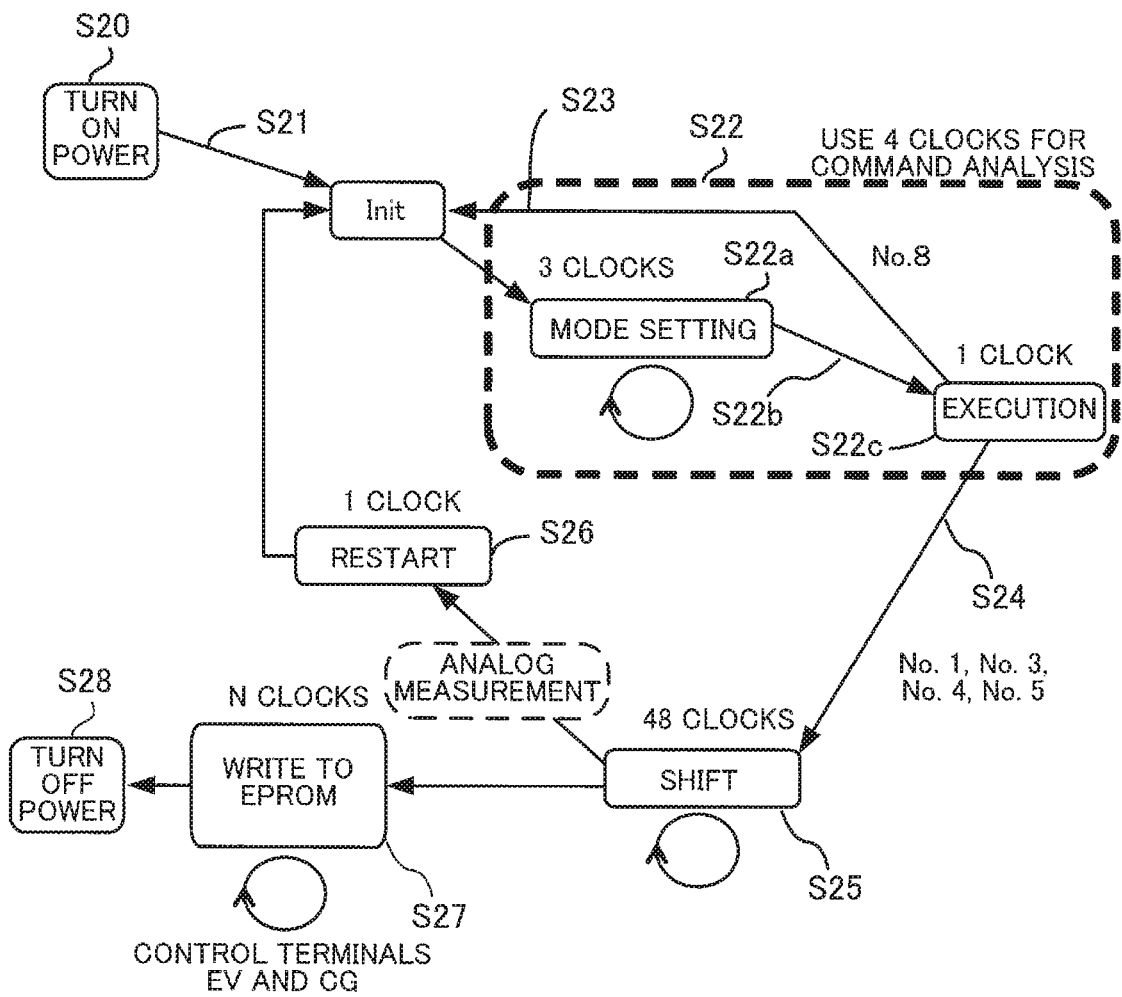
FIG. 12 illustrates state transitions.

State transitions which occur at the time of performing trimming on the EPROM 11 will now be described. FIG. 12 illustrates state transitions. Numbers in a state transition diagram of FIG. 12 correspond to the numbers in the table T1 of FIG. 11.

(S20) The mode setting circuit 130 turns on power.

(S21) After power is applied, the mode setting circuit 130 makes a transition to an initialized state (Init) by the reset operation of the mode setting circuit 130. The initialized state (Init) is a data input wait state.

(S22) The mode setting circuit 130 goes into a command analysis state. The command analysis state is a state in which the mode setting circuit 130 analyzes a command transmitted from the tester 200. Four clocks are used for a command analysis on the basis of a value set in the 3-bit command register in the mode setting circuit 130.

(S22a) If the mode setting circuit 130 uses the four clocks for a command analysis, the mode setting circuit 130 uses three clocks of the four clocks for mode setting.

(S22b) After the mode setting circuit 130 sets a mode, the mode setting circuit 130 makes a transition to an execution state.

(S22c) The execution state is a state in which the mode setting circuit 130 determines a state to which the mode setting circuit 130 next makes a transition for the set mode. At this time the mode setting circuit 130 uses one clock of the four clocks for determining a state to which the mode setting circuit 130 next makes a transition.

(S23) If the set mode is "reset" (No. 8 in the table T1), then the mode setting circuit 130 makes a transition to the initialized state (Init) after performing a reset.

(S24) If the set mode is one of No. 1, No. 3, No. 4, and No. 5 in the table T1, then the mode setting circuit 130 makes a transition to a shift state.

(S25) The shift state is a state in which the mode setting circuit 130 executes the operation of No. 1, No. 3, No. 4, or No. 5 corresponding to a value set in the 3-bit command register. A 48-bit shift register which is an auxiliary memory uses 48 clocks for performing shift operation.

In the case of No. 1 (output), the 48-bit shift register performs 48-bit shift operation and the mode setting circuit 130 outputs serial data. In the case of No. 3 (reference), the 48-bit shift register performs 48-bit shift operation after the mode setting circuit 130 writes a value in the EPROM 11 to the 48-bit shift register.

Furthermore, in the case of No. 4 (adjustment), the mode setting circuit 130 outputs the logical sum of a value in the EPROM 11 and data after the 48-bit shift operation.

In addition, in the case of No. 5 (write), the mode setting circuit 130 writes a value in the 48-bit shift register to the EPROM 11.

(S26) After the 48-bit shift operation is performed and operation in each mode is completed, the mode setting circuit 130 uses the next clock for initializing the mode setting and going into a restart state. The restart state is for making a transition to the initialized state (Init). After the 48-bit shift operation is performed and before the mode setting circuit 130 makes a transition to the restart state, analog measurement may be performed.

(S27) The tester 200 uses determined N clocks for writing data to the EPROM 11 by applying voltages to the terminals EV and CG. By doing so, the tester 200 sets the data and ends trimming.

(S28) The mode setting circuit 130 turns off power.

Figure 13:
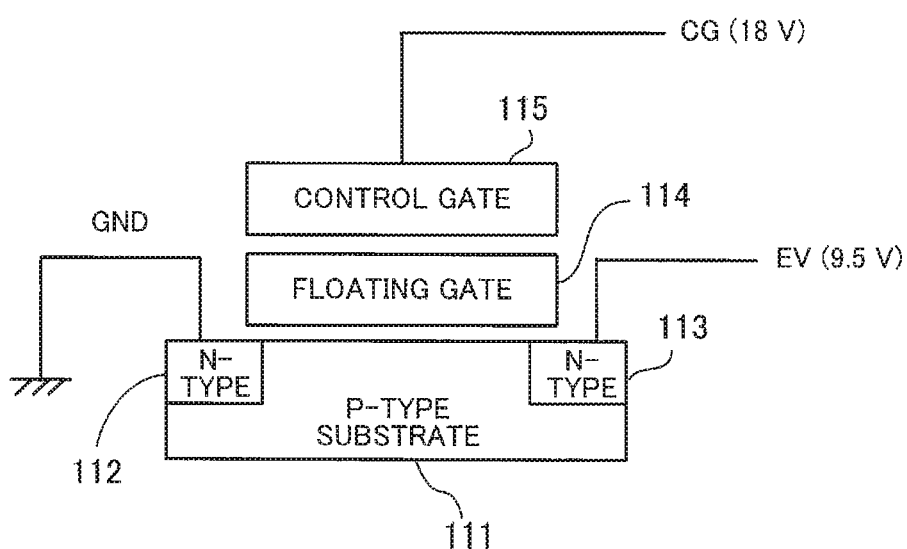
FIG. 13 illustrates the structure of a section of an EPROM.

The structure of the EPROM 11 will now be described. FIG. 13 illustrates the structure of a section of the EPROM. With the EPROM 11 a place where 1-bit data is stored corresponds to one field-effect transistor illustrated in FIG. 13.

In the structure of a section of the EPROM 11, a source of an n-type semiconductor 112 and a drain of an n-type semiconductor 113 are formed at both ends of a p-type substrate 111 of a p-type semiconductor. The source of the n-type semiconductor 112 is connected to GND. For example, a voltage of 9.5 volts is applied from the terminal EV to the drain of the n-type semiconductor 113.

In addition, a floating gate 114 is disposed over the p-type substrate 111. The floating gate 114 is not wired and is not connected to any parts in an integrated circuit. The floating gate 114 is surrounded by an oxide layer and is insulated. Furthermore, a control gate 115 is disposed over the floating gate 114. For example, a voltage of 18 volts is applied from the terminal CG to the control gate 115.

Figure 14:
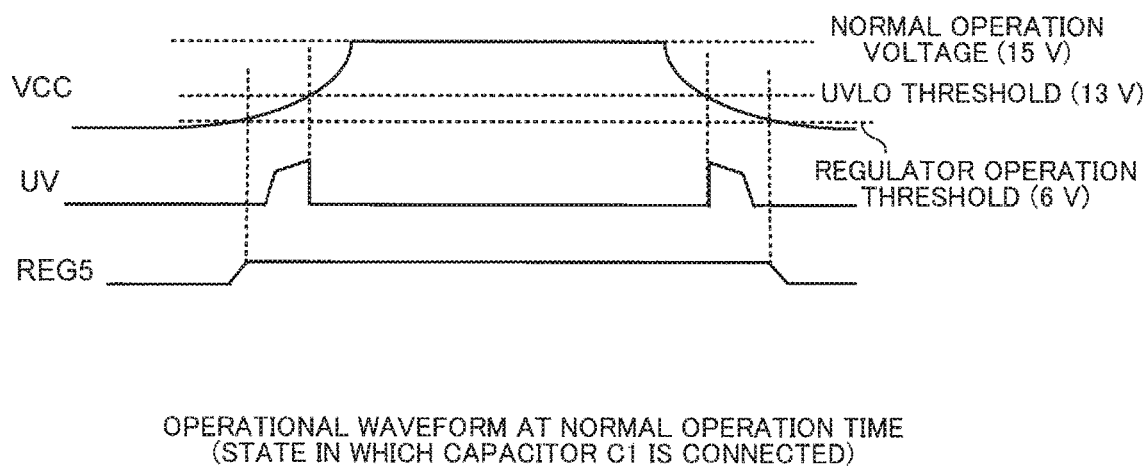
FIG. 14 illustrates an operational waveform at normal operation time.

The operational waveforms of the power source voltage VCC, the signal UV, and the internal voltage REG5 will now be described. FIG. 14 illustrates an operational waveform at normal operation time. At normal operation time a power source voltage VCC of 15 volts is applied to the gate driver unit 10 via the line L1 illustrated in FIG. 4 to drive the IGBT element 20.

The power source voltage VCC (=15 V) is higher than the UVLO threshold (=13 V). Therefore, as stated above, the UVLO section 12-2 sets the signal UV to 0 level and outputs it. Furthermore, because a starting voltage of the regulator 12-1 is 6 V, the regulator 12-1 outputs an internal voltage REG5 of 5 volts.

The signal UV is at the 0 level. Therefore, as stated above, the switch SW1 sets the signal OW/EV to GND level and outputs it to the control circuit 13. As a result, trimming control of the EPROM 11 is stopped.

On the other hand, at the normal operation time a power source voltage VCC of 15 volts is applied to the gate driver unit 10. Accordingly, the tester 200 turns on the switch SW4 by the use of the signal C1CTL illustrated in FIG. 4 and connects one end of the capacitor C1 to the line L1. As a result, the capacitor C1 functions as a bypass capacitor and an output of the regulator 12-1 is stabilized.

Figure 15:
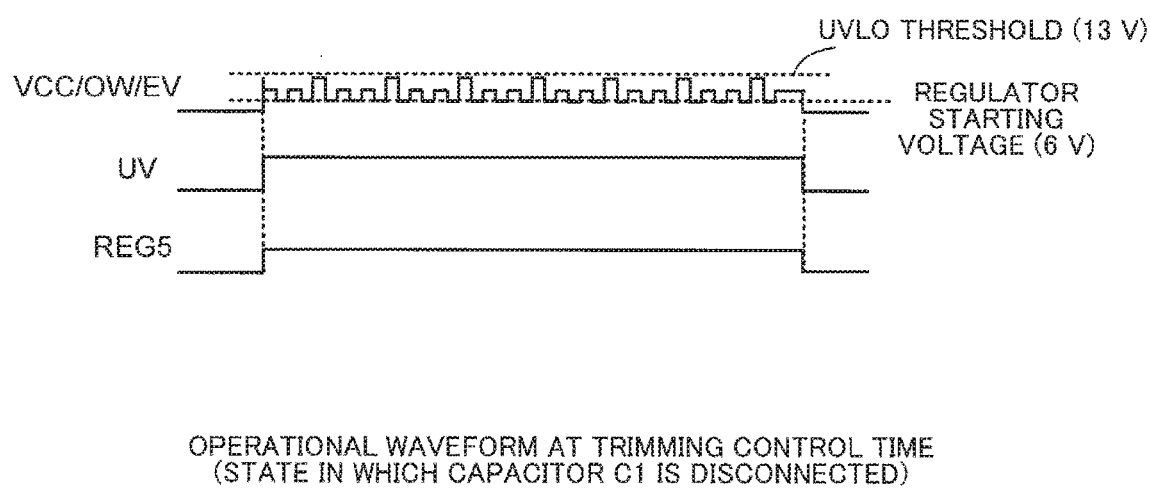
FIG. 15 illustrates an operational waveform at trimming control time.

FIG. 15 illustrates an operational waveform at trimming control time. At trimming time write to or read from the EPROM 11 is performed. Therefore, the signal OW/EV is inputted to the gate driver unit 10 via the line L1 illustrated in FIG. 4.

Furthermore, at the trimming time the power source voltage VCC is in the range of the regulator operating threshold (=6 V) to the UVLO threshold (=13 V). A clock and data which vary in this voltage range are superimposed in the signal OW/EV by the tester 200.

The level of the signal OW/EV is lower than the UVLO threshold (=13 V). Therefore, as state above, the UVLO section 12-2 sets the signal UV to 1 level and outputs it. Furthermore, because a starting voltage of the regulator 12-1 is 6 V, the regulator 12-1 outputs an internal voltage REG5 of 5 volts.

The signal UV is at the 1 level. Therefore, as state above, the switch SW1 outputs to the control circuit 13 the signal OW/EV whose voltage level is in the range of 6 to 13 V. The control circuit 13 performs trimming on the EPROM 11.

On the other hand, at the trimming time the gate drive function of the gate driver unit 10 is stopped. Therefore, the tester 200 turns off the switch SW4 by the use of the signal C1CTL illustrated in FIG. 4 and disconnects one end of the capacitor C1 from the line L1.

As stated above, at the trimming time the capacitor C1 is disconnected from a power source terminal. This suppresses delay of a pulse signal flowing along the line L1. As a result, trimming speed is increased.

An operational waveform at the time of trimming the EPROM 11 will now be described. FIG. 16 illustrates the waveform of the operation of writing to the EPROM. The mode setting circuit 130 sets a write mode and performs write data setting on the EPROM 11. After that, data is written to the EPROM 11.

For a time period for which the data is written to the EPROM 11, the terminal OUT/CG is used as an input terminal and a voltage of 18 volts is applied from the tester 200. That is to say, when the data is written to the EPROM 11, the tester 200 supplies from the terminal OUT/CG a voltage to be applied to a memory cell (terminal CG) of the EPROM 11.

Furthermore, the tester 200 raises the voltage of the signal VCC/OW/EV to 9.5 V and applies it to the gate driver unit 10, via the line L1 to which the signal VCC/OW/EV is applied. If normal operation is performed, the power source voltage VCC is higher than or equal to 13 V. Therefore, when the data is written to the EPROM 11, the power source voltage VCC is set to a value (9.5 V in this example) lower than 13 V to prohibit normal operation.

FIG. 17 illustrates the waveform of the operation of reading out from the EPROM. The mode setting circuit 130 sets a read mode, inputs a determined clock pattern to the EPROM 11, and reads out data (memory data EPD) from the EPROM 11. The memory data EPD read out from the EPROM 11 is outputted as the alarm signal AL from the gate driver unit 10.

As illustrated in the state transition diagram of FIG. 12, after the data is read out from the EPROM 11, a restart is performed once and a transition to an initialized state is made.

FIG. 18 illustrates a waveform obtained in the case of carrying out an adjustment by normal operation based on data set in the EPROM. After a threshold for overcurrent detection or overheat detection is set, a normal operation mode is set, whether or not desired operation is performed is checked, and an adjustment is carried out. FIG. 18 illustrates a waveform obtained at this time.

The mode setting circuit 130 sets a write mode and sets write data in the shift register (S.R.). After that, the tester 200 raises the voltage of the signal VCC/OW/EV to the power source voltage VCC at normal operation time (=15 V).

As a result, the gate driver unit 10 performs normal operation and the IGBT element 20 is driven. The tester 200 corrects a set threshold or the like written to the EPROM 11 by finding the logical sum (OR) of data written at trimming time to the shift register (S.R.) and data written to the EPROM 11. By doing so, the tester 200 checks whether or not desired operation is performed, while observing the alarm signal AL.

As has been described, according to the present disclosure dedicated terminals are not disposed on the EPROM 11. The existing terminals of the gate driver unit and signals are used for trimming the EPROM 11 or writing data to or reading out data from the EPROM 11.

Furthermore, data may be read out from the EPROM 11 in a state in which an IC of the gate driver unit 10 is mounted in an IPM. In addition, the type of an IPM or the gate driver unit 10 may be selected or identified. This leads to traceability.

A table of the relationships among the above operation modes, switches, and signals is given in FIG. 19. Furthermore, the functions of the OC terminal and OH terminal of the gate driver unit 10 are the same as those of terminals of FIG. 2 through which the current detection signal OC and the temperature detection signal OH flow.

At the time of trimming EPROM 11, usually the signal C1CTL is put into an off state to disconnect the capacitor C1. At the time of trimming EPROM 11, however, the signal C1CTL may be put into an on state, depending on conditions, to connect the capacitor C1 (however, pulse delay may occur by the influence of the capacitor C1).

A modification in which an operation range is divided by setting two UVLO thresholds will now be described. In the above example, the UVLO section 12-2 has one UVLO threshold (=13 V). As a result, as illustrated in FIG. 9, an operation range in which a level of the signal OW/EV exceeds (is higher than) the UVLO threshold is a range for gate drive operation and an operation range in which a level of the signal OW/EV is lower than the UVLO threshold is a range for the trimming operation of the EPROM 11.

On the other hand, with the modification control is performed by setting two UVLO thresholds and dividing an operation range (hereinafter a UVLO section having two UVLO thresholds will be referred to as a UVLO section 12-2a).

Figure 20:
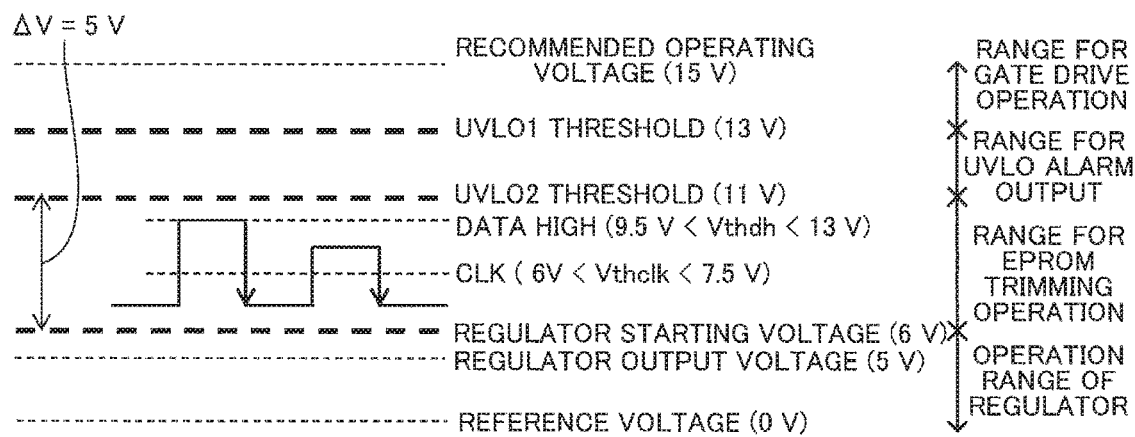
FIG. 20 illustrates voltage levels obtained in the case of dividing an operation range by setting two UVLO thresholds.

FIG. 20 illustrates voltage levels obtained in the case of dividing an operation range by setting two UVLO thresholds. The UVLO section 12-2a has a UVLO1 threshold (=13 V) and a UVLO2 threshold (=11 V) as the two UVLO thresholds.

In this case, as illustrated in FIG. 20, the range of the UVLO1 threshold (13 V) to a recommended operating voltage (15 V) is an operation range for gate drive operation. Furthermore, the range of the UVLO2 threshold (11 V) to the UVLO1 threshold (13 V) is an operation range for a UVLO alarm output. In addition, the range of a regulator starting voltage (6 V) to the UVLO2 threshold (11 V) is an operation range for the trimming operation of the EPROM 11.

The range for the UVLO alarm output is a voltage range in which gate drive by the gate driver unit 10 or trimming of the EPROM 11 is not performed. If the UVLO section 12-2a recognizes that a level of the power source voltage VCC is in the range of the UVLO2 threshold (11 V) to the UVLO1 threshold (13 V) for a determined period of time, then the UVLO section 12-2a outputs a UVLO alarm. The UVLO alarm is transmitted as the alarm signal AL.

As stated above, a margin is left for the amplitude swing of the power source voltage VCC by setting the two UVLO thresholds. By doing so, the range for gate drive operation and the range for trimming the EPROM 11 are separated stably.

Figure 21:
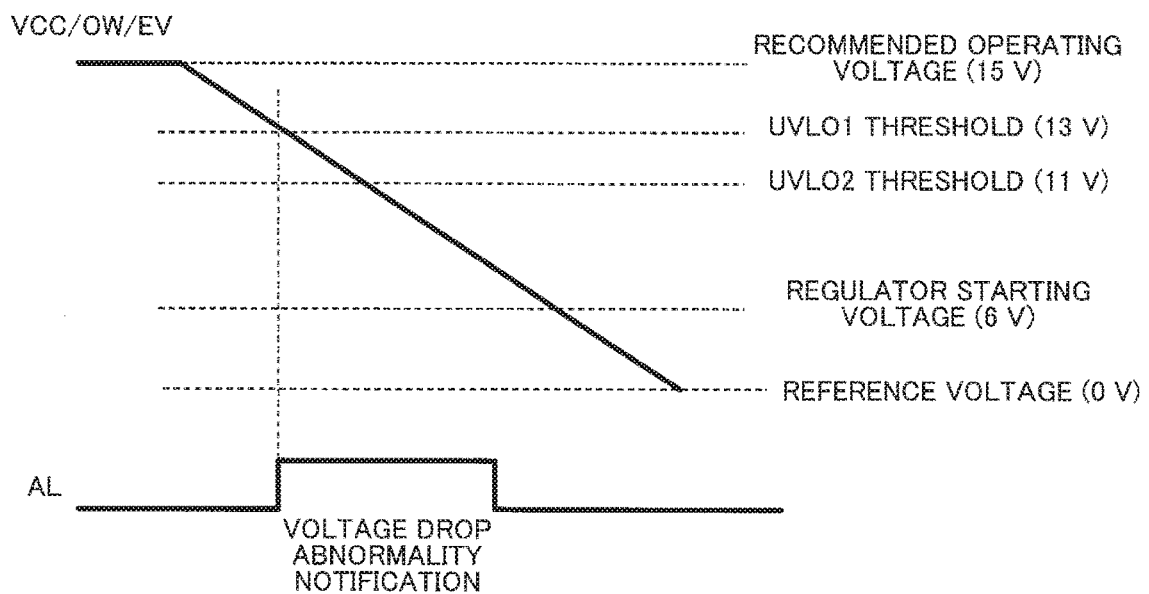
FIG. 21 is a view for describing operation performed in the case of power being shut off at normal operation time.

Operation performed in the case of power being shut off at normal operation time will now be described. FIG. 21 is a view for describing operation performed in the case of power being shut off at normal operation time. If power is shut off at normal operation time, the voltage of the signal VCC/OW/EV falls at a constant rate of dV/dt from the relationship between the current consumptions of the bypass capacitor C1 and the gate driver unit 10.

Even if the voltage level of the signal VCC/OW/EV falls below the UVLO1 threshold (13 V) at normal operation time and falls within the range for the trimming operation of the EPROM 11, a pulse needed for data communication between the gate driver unit 10 and the tester 200 is not applied. As a result, trimming control of the EPROM 11 is not performed. Therefore, a voltage drop abnormality notification to the effect that a voltage drops at normal operation time is outputted as the alarm signal AL from the gate driver unit 10.

According to the disclosed technique, an increase in circuit scale is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device comprising:
   a terminal configured to receive a voltage signal which includes a pulse signal having a plurality of different voltage levels superimposed on a power source voltage;
   a first control circuit including
      a monitoring section which
         receives the voltage signal from the terminal,
         monitors a level of the voltage signal, and
         outputs a monitoring result, and
      a regulator which generates an internal voltage;
   a memory which receives the internal voltage; and
   a second control circuit which
      receives the internal voltage,
      receives the voltage signal,
      reproduces a clock and data from the pulse signal having the plurality of different voltage levels, on the basis of the monitoring result, and
      performs trimming on the memory using the clock and the data.
2. The semiconductor device according to claim 1, wherein
   the first control circuit has an external element connected thereto, for performing drive control of the external element; and
   the monitoring section
      determines that a range in which the level of the voltage signal is higher than a predetermined threshold is an operation range for the drive control of the external element, and determines that a range in which the level of the voltage signal is between a starting voltage of the regulator and the threshold is an operation range for control of the trimming.

3. The semiconductor device according to claim 2, further comprising:
a first switch which receives the monitoring result and outputs a switching signal according to a value of the monitoring result, wherein
the monitoring section outputs a first monitoring result at a time when the level of the voltage signal is higher than the threshold and outputs a second monitoring result at a time when the level of the voltage signal is between the starting voltage of the regulator and the threshold;
responsive to the first monitoring result, the first switch outputs a stop signal as the switching signal to the second control circuit, to cause the second control circuit to stop the trimming and to cause the first control circuit to perform the drive control of the external element; and
responsive to the second monitoring result, the first switch applies to the second control circuit the pulse signal as the switching signal, to cause the second control circuit to perform the trimming and to cause the first control circuit to stop the drive control of the external element, the voltage levels of the pulse signal being between the starting voltage of the regulator and the threshold.

4. The semiconductor device according to claim 3, further comprising:
a second switch which
receives alarm data from the first control circuit and memory data from the memory via the second control circuit at the time of the trimming, and
switches an output,
the alarm data indicating a state of the external element, wherein
the second control circuit
receives the switching signal,
outputs a first select signal at a time when the switching signal is a ground, and
outputs a second select signal at a time when the switching signal is the pulse signal; and
the second switch
outputs the alarm data from a single terminal responsive to the first select signal, and
outputs the memory data from the single terminal responsive to the second select signal.

5. The semiconductor device according to claim 1, wherein:
the second control circuit includes a switch which
receives a write setting signal indicative of whether to write the data to the memory at a time of the trimming and a drive signal for driving an external element, and
switches an output;
when the write setting signal is in an off state, the switch outputs the drive signal from a single terminal to the external element; and
when the write setting signal is in an on state, the switch applies a predetermined voltage inputted from the single terminal to the memory.

6. A semiconductor device, comprising:
a first control circuit including
a monitoring section which
receives a voltage signal which includes a pulse signal having a plurality of different voltage levels superimposed on a power source voltage,
monitors a level of the voltage signal, and
outputs a monitoring result, and
a regulator which generates an internal voltage;
a memory which receives the internal voltage; and
a second control circuit which
receives the internal voltage,
reproduces a clock and data from the pulse signal on the basis of the monitoring result, and
performs trimming on the memory using the clock and the data, wherein:
the semiconductor device is connectable to a switch and a capacitor disposed outside the semiconductor device, one end of the switch being connected to a line along which the voltage signal flows, another end of the switch being connected to one end of the capacitor, another end of the capacitor being connected to a ground;
at a time of drive control of an external element, the switch is turned on on the basis of external instructions, to connect the one end of the capacitor to the line; and
at a time of the trimming, the switch is turned off on the basis of the external instructions, to disconnect the one end of the capacitor from the line.

7. A semiconductor, comprising:
a first control circuit including
a monitoring section which
receives a voltage signal which includes a pulse signal having a plurality of different voltage levels superimposed on a power source voltage,
monitors a level of the voltage signal, and
outputs a monitoring result, and
a regulator which generates an internal voltage;
a memory which receives the internal voltage; and
a second control circuit which
receives the internal voltage,
reproduces a clock and data from the pulse signal on the basis of the monitoring result, and
performs trimming on the memory using the clock and the data, wherein
the monitoring section
sets a range in which the level of the voltage signal is higher than a first predetermined threshold, as an operation range for drive control of an external element;
sets a range in which the level of the voltage signal is between a starting voltage of the regulator and a second predetermined threshold, as an operation range for control of the trimming; and
recognizes, as a voltage abnormality state, a state in which the level of the voltage signal is between the first threshold and the second threshold for a predetermined period.

* * * * *